(12) United States Patent
Park et al.

(10) Patent No.: US 12,557,441 B2
(45) Date of Patent: Feb. 17, 2026

(54) DISPLAY DEVICE USING MICRO-LEDS AND METHOD FOR MANUFACTURING SAME

(71) Applicant: LG ELECTRONICS INC., Seoul (KR)

(72) Inventors: Chilkeun Park, Seoul (KR); Junghoon Kim, Seoul (KR); Chunghyun Lim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 681 days.

(21) Appl. No.: 17/763,893

(22) PCT Filed: Oct. 2, 2019

(86) PCT No.: PCT/KR2019/012920
§ 371 (c)(1),
(2) Date: Mar. 25, 2022

(87) PCT Pub. No.: WO2021/060595
PCT Pub. Date: Apr. 1, 2021

(65) Prior Publication Data
US 2022/0320371 A1 Oct. 6, 2022

(30) Foreign Application Priority Data

Sep. 26, 2019 (KR) .......................... 10-2019-0118593

(51) Int. Cl.
*H10H 20/821* (2025.01)
*H01L 23/00* (2006.01)
(Continued)

(52) U.S. Cl.
CPC ......... *H10H 20/821* (2025.01); *H01L 25/167* (2013.01); *H10H 20/018* (2025.01);
(Continued)

(58) Field of Classification Search
CPC ..... H01L 33/44; H01L 33/0093; H01L 33/24; H01L 25/167; H01L 24/05; H01L 24/29;
(Continued)

(56) References Cited

U.S. PATENT DOCUMENTS 9,397,265 B2    7/2016   Oraw et al.
10,818,819 B2*  10/2020  Tsai ...................... H01L 33/382
(Continued)

FOREIGN PATENT DOCUMENTS

CN    104347768 A   2/2015
JP    2007-19467 A  1/2007
(Continued)

*Primary Examiner* — Jessica S Manno
*Assistant Examiner* — Ricky Verdes
(74) *Attorney, Agent, or Firm* — Birch, Stewart, Kolasch & Birch, LLP

(57) ABSTRACT

The present specification provides a display device using semiconductor light-emitting diodes which are self-assembled in fluid, and a method for manufacturing same. Specifically, the semiconductor light-emitting diode comprises: a first-conductive-type electrode layer and a second-conductive-type electrode layer; a first-conductive-type semiconductor layer electrically connected to the first-conductive-type electrode layer; an active layer provided on the first-conductive-type semiconductor layer; and a second-conductive-type semiconductor layer provided on the active layer and electrically connected to the second-conductive-type electrode layer, wherein one surface of the second-conductive-type semiconductor layer comprises a mesa structure formed by etching a portion of the one surface, and the second-conductive-type electrode layer is provided on the one surface comprising the mesa structure of the second-conductive-type semiconductor layer.

19 Claims, 26 Drawing Sheets

(51) Int. Cl.
*H01L 25/16* (2023.01)
*H10H 20/01* (2025.01)
*H10H 20/84* (2025.01)

(52) U.S. Cl.
CPC ............ *H10H 20/84* (2025.01); *H01L 24/05* (2013.01); *H01L 24/29* (2013.01); *H01L 24/32* (2013.01); *H01L 24/83* (2013.01); *H01L 24/95* (2013.01); *H01L 2224/05573* (2013.01); *H01L 2224/29006* (2013.01); *H01L 2224/32145* (2013.01); *H01L 2224/83203* (2013.01); *H01L 2224/83888* (2013.01); *H01L 2224/95101* (2013.01); *H01L 2224/95133* (2013.01); *H01L 2924/12041* (2013.01); *H10H 20/034* (2025.01)

(58) Field of Classification Search
CPC ......... H01L 24/32; H01L 24/83; H01L 24/95; H01L 2224/05573; H01L 2224/29006; H01L 2224/32145; H01L 2224/83203; H01L 2224/83888; H01L 2224/95101; H01L 2224/95133; H01L 2924/12041; H01L 25/0753; H01L 21/28; H01L 21/76838; H01L 21/76895; H01L 2224/0344; H10H 20/819; H10H 20/821; H10H 20/018; H10H 20/84; H10H 20/034; H10H 20/032; H10H 20/833; H10H 20/01; H10H 20/832; H10H 29/142

See application file for complete search history.

(56) References Cited

U.S. PATENT DOCUMENTS

| | | | |
|---|---|---|---|
| 12,074,264 B2 * | 8/2024 | Kim | H10H 20/853 |
| 2010/0176751 A1 * | 7/2010 | Oshio | H10H 20/857 |
| | | | 257/E33.001 |
| 2015/0041836 A1 * | 2/2015 | Saito | H10H 20/856 |
| | | | 257/89 |
| 2017/0133550 A1 * | 5/2017 | Schuele | H10H 20/824 |
| 2020/0028028 A1 | 1/2020 | Tsai et al. | |

FOREIGN PATENT DOCUMENTS

| | | |
|---|---|---|
| KR | 10-2009-0113223 A | 10/2009 |
| KR | 10-2018-0030454 A | 3/2018 |
| KR | 10-2019-0031047 A | 3/2019 |
| KR | 10-2019-0085892 A | 7/2019 |
| KR | 10-2019-0088929 A | 7/2019 |
| KR | 10-2019-0106885 A | 9/2019 |
| TW | I661575 B | 6/2019 |

* cited by examiner

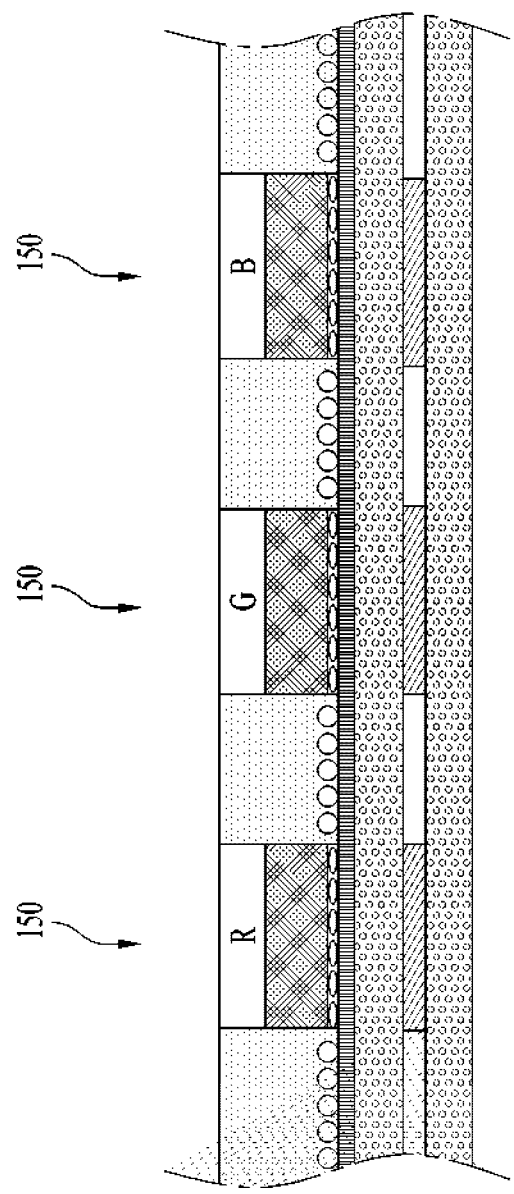

(a)

(b)

(a)

(b)

DISPLAY DEVICE USING MICRO-LEDS AND METHOD FOR MANUFACTURING SAME

CROSS REFERENCE TO RELATED APPLICATIONS

This application is the National Stage filing under 35 U.S.C. 371 of International Application No. PCT/KR2019/012920, filed on Oct. 2, 2019, which claims the benefit of earlier filing date and right of priority to Korean Application No. 10-2019-0118593, filed on Sep. 26, 2019, the entire contents of which are hereby expressly incorporated by reference into the present application.

TECHNICAL FIELD

The present disclosure relates to technology related to a display device, and more particularly to a method for manufacturing a display device using a micro-light emitting diode (micro-LED) and a substrate used in manufacturing the display device.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

In order to implement a display device using the above semiconductor light emitting elements, a large number of semiconductor light emitting elements need to be mounted on a substrate. Recently, a pick & place method using a transfer substrate or methods of assembling semiconductor light emitting elements to a substrate in a fluid has been studied.

However, there are still problems to be overcome in terms of manufacturing costs, assembly speed, and luminous efficiency.

Therefore, the present disclosure proposes a semiconductor light emitting element having a new structure capable of being self-assembled in a fluid and of exhibiting high luminous efficiency, and a method of manufacturing a display device using the same.

DISCLOSURE

Technical Task

An object of an embodiment of the present disclosure is to provide a display device using a semiconductor light emitting element and a method of manufacturing the same.

Another object of an embodiment of the present disclosure is to provide a display device capable of reducing manufacturing costs using a vertical type semiconductor light emitting element.

Still another object of an embodiment of the present disclosure is to provide a vertical type semiconductor light emitting element that is configured to be self-assembled in a fluid and has improved luminous efficiency, and a display device using the same.

Further, another object of the present disclosure is to solve various problems not mentioned herein. Those skilled in the art will appreciate the embodiments of the present disclosure through the description and drawings to be described later.

Technical Solutions

In order to accomplish the above objects, in a display device using a semiconductor light emitting element, the semiconductor light emitting element includes a first conductivity-type electrode layer and a second conductivity-type electrode layer located at respective ends of the semiconductor light emitting element, a first conductivity-type semiconductor layer electrically connected to the first conductivity-type electrode layer, an active layer located on the first conductivity-type semiconductor layer, and a second conductivity-type semiconductor layer located on the active layer and electrically connected to the second conductivity-type electrode layer. The second conductivity-type semiconductor layer has one surface including a mesa structure formed by etching a portion of the one surface, and the second conductivity-type electrode layer is located on the one surface including the mesa structure of the second conductivity-type semiconductor layer.

According to an embodiment, the second conductivity-type electrode layer may be a transparent electrode layer.

According to an embodiment, the semiconductor light emitting element may further include a conductive adhesive layer located on one surface of the first conductivity-type electrode layer, and the conductive adhesive layer may be electrically connected to the first conductivity-type electrode layer.

According to an embodiment, the first conductivity-type electrode layer may have a first area smaller than a second area of the conductive adhesive layer and larger than a third area of the upper surface of the mesa structure.

According to an embodiment, the semiconductor light emitting element may include a first passivation layer surrounding the upper surface and the side surface of the semiconductor light emitting element and a second passivation layer surrounding a portion of the lower surface of the semiconductor light emitting element, and the second passivation layer may be located in the region between the first conductivity-type semiconductor layer and the conductive adhesive layer.

According to an embodiment, the assembly substrate may include an assembly electrode configured to generate dielectrophoretic force using an electric field in the relationship with the semiconductor light emitting element.

According to an embodiment, the mesa structure may have a height equal to or greater than the effective distance of the dielectrophoretic force applied to the semiconductor light emitting element by the assembly substrate.

According to an embodiment, the conductive adhesive layer may be a low-melting-point metal layer having a melting point of 100 to 250 degrees Celsius.

According to an embodiment, the semiconductor light emitting element may be an LED having a size in micrometers (micro-LED).

A method of manufacturing a display device using a semiconductor light emitting element according to another embodiment of the present disclosure includes forming a semiconductor light emitting structure having a mesa-shaped surface on a growth substrate, transferring the semiconductor light emitting structure to a temporary substrate, manufacturing a vertical type semiconductor light emitting element by forming a conductivity-type electrode layer and a conductive adhesive layer on the semiconductor light emitting structure, and assembling the vertical type semiconductor light emitting element to an assembly substrate in a fluid using an electric field and a magnetic field.

According to an embodiment, the forming a semiconductor light emitting structure may include stacking a first conductivity-type semiconductor layer, an active layer, and a second conductivity-type semiconductor layer, forming a mesa shape by etching some regions of the upper surface of the second conductivity-type semiconductor layer, forming a second conductivity-type electrode layer on the upper surface of the second conductivity-type semiconductor layer including the mesa shape, performing isolation to define an individual semiconductor light emitting structure through an etching process, and forming a first passivation layer on the upper surface and the side surface of the semiconductor light emitting structure.

According to an embodiment, the manufacturing a vertical type semiconductor light emitting element may include forming a first conductivity-type electrode layer in a first region of the first conductivity-type semiconductor layer exposed through the transferring and forming a second passivation layer in a second region of the first conductivity-type semiconductor layer exposed through the transferring.

According to an embodiment, the manufacturing a vertical type semiconductor light emitting element may further include forming a conductive adhesive layer so as to overlap the first conductivity-type electrode layer and the second passivation layer.

According to an embodiment, the assembly substrate may include an assembly recess formed therein to allow a semiconductor light emitting element to be assembled thereto, and the conductive adhesive layer of the semiconductor light emitting element may be brought into contact with the bottom surface of the assembly recess.

Advantageous Effects

According to an embodiment of the present disclosure, a display device using a semiconductor light emitting element and a method of manufacturing the same may be provided.

Specifically, a vertical type semiconductor light emitting element including a mesa structure formed on one surface thereof is manufactured so as to be assembled in one designated direction in a fluid. The mesa structure is formed by etching some regions of a conductivity-type semiconductor layer, and a transparent electrode layer is formed on the surface including the mesa structure, thus leading to improved semiconductor luminous efficiency.

In addition, the number of vertical type semiconductor light emitting elements that can be manufactured on a growth substrate having a given area is greater than the number of horizontal type semiconductor light emitting elements, and thus it is less costly to manufacture a display device.

Further, according to another embodiment of the present disclosure, there are additional technical effects not mentioned here. Those skilled in the art can understand the present disclosure through the purposes of the specification and drawings.

DESCRIPTION OF DRAWINGS

FIGS. 5A to 5C are conceptual diagrams illustrating various examples of color implementation with respect to a flip-chip type semiconductor light emitting element.

BEST MODE FOR DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like, and may be used interchangeably therewith.

Figure 1:
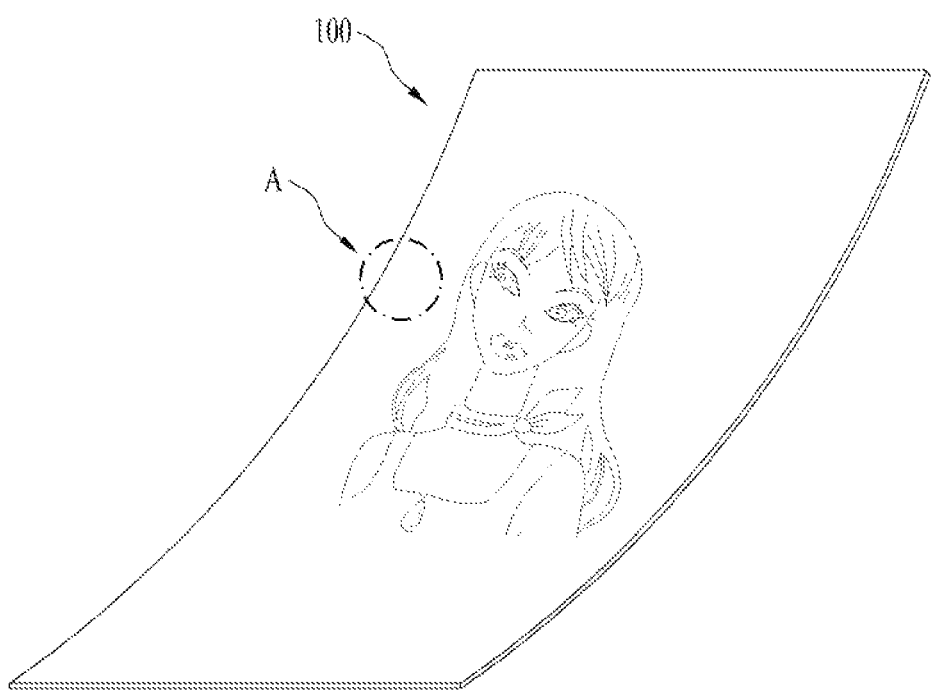
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
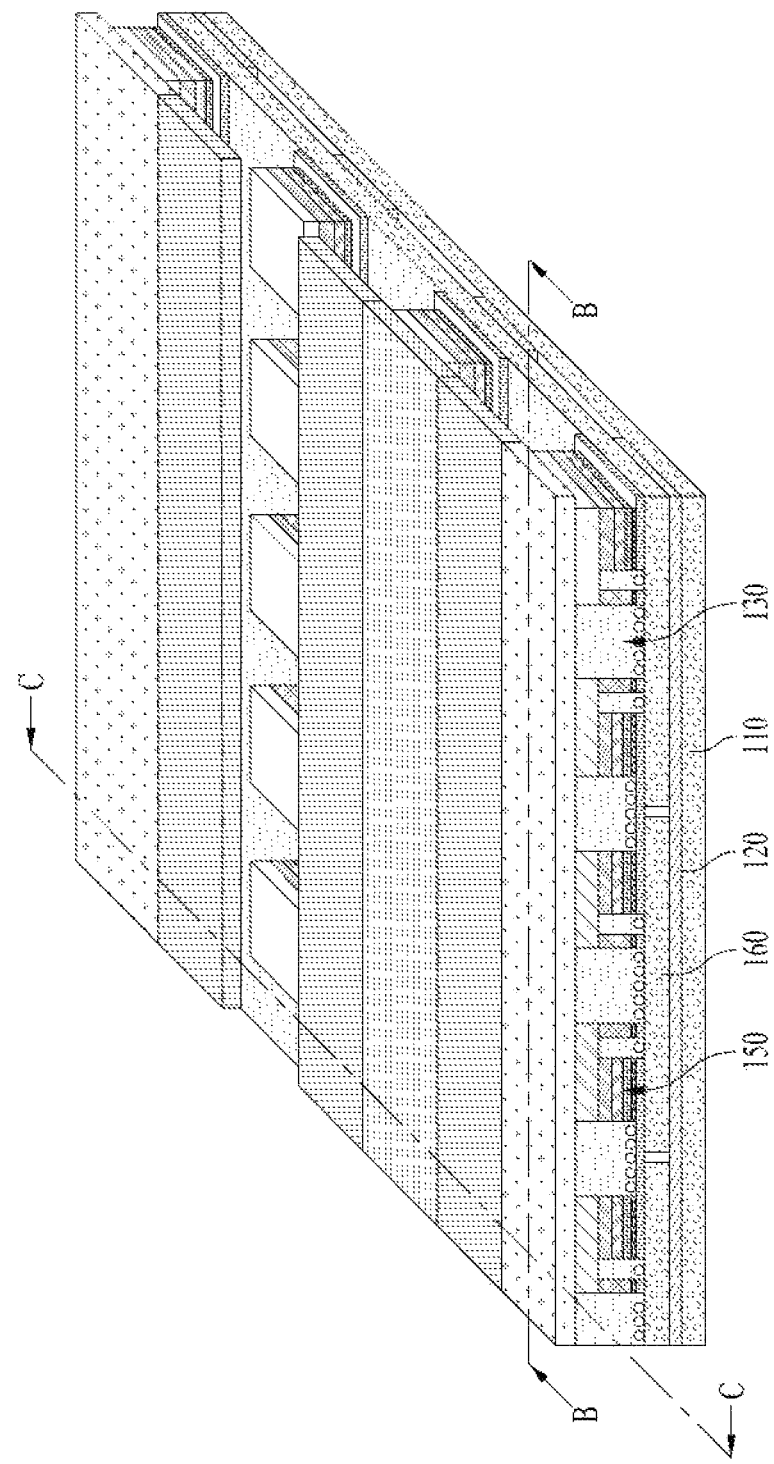
FIG. 2 is a partially enlarged diagram showing a part A shown in FIG. 1.

FIG. 2 is a partially enlarged view showing part A of FIG. 1.

Figure 3A:
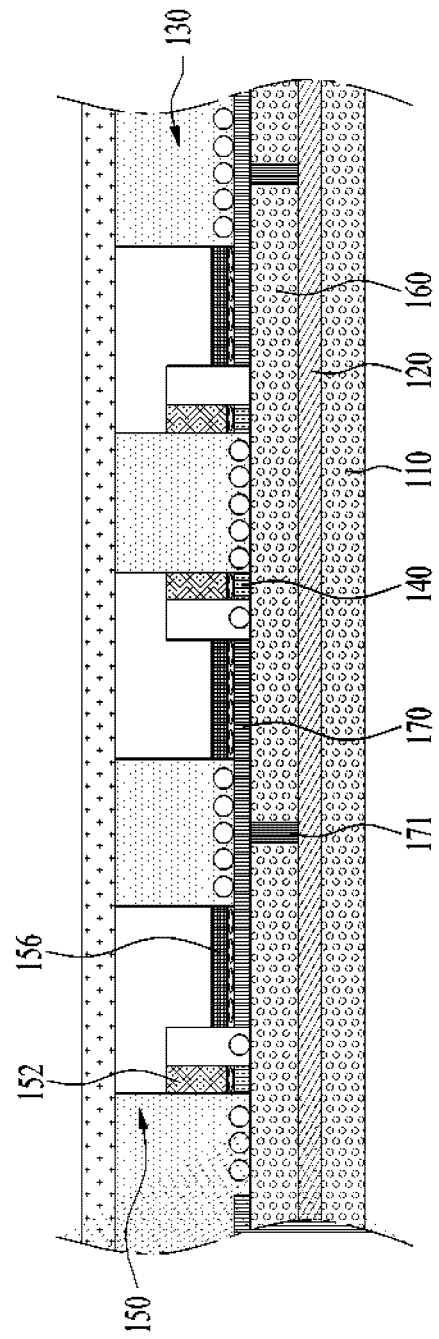
FIGS. 3A and 3B are cross-sectional diagrams taken along the cutting lines B-B and C-C in FIG. 2, respectively.
Figure 3B:
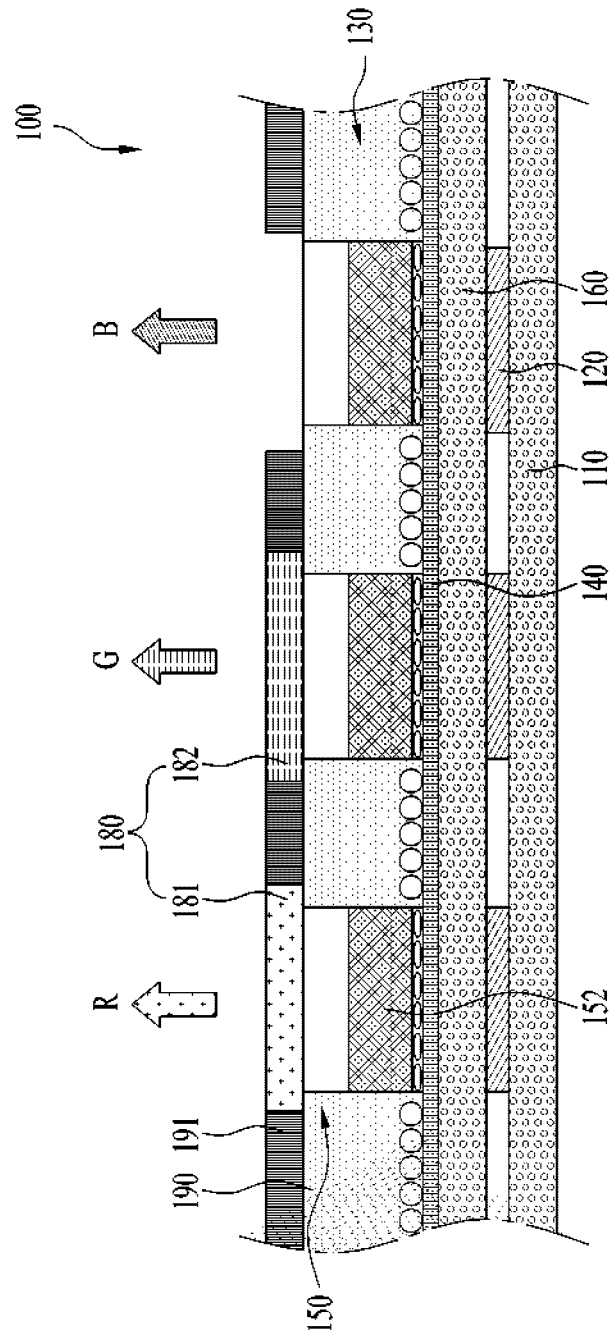

FIGS. 3A and 3B are cross-sectional views taken along lines B-B and C-C in FIG. 2.

Figure 4:
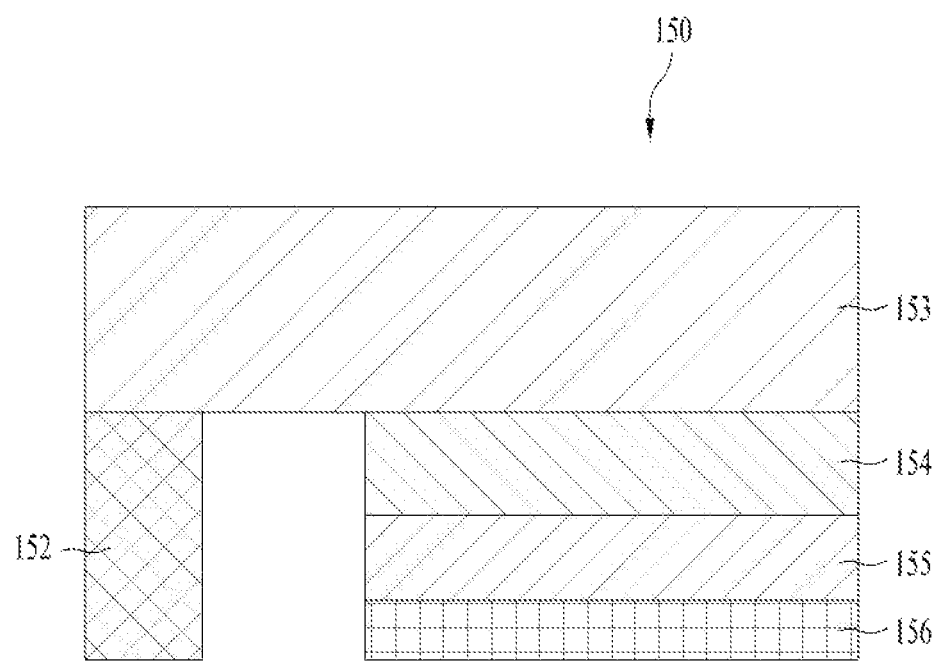
FIG. 4 is a conceptual diagram illustrating the flip-chip type semiconductor light emitting element of FIGS. 3A and 3B.

FIG. 4 is a conceptual view illustrating the flip-chip type semiconductor light emitting element of FIGS. 3A and 3B (also collectively referred to below as FIG. 3).

Figure 5B:
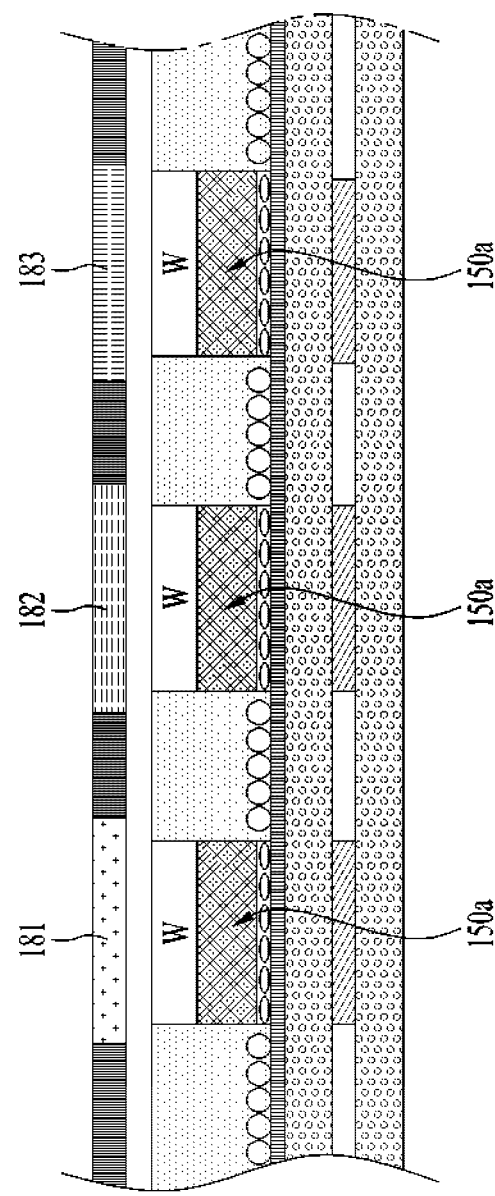
Figure 5C:
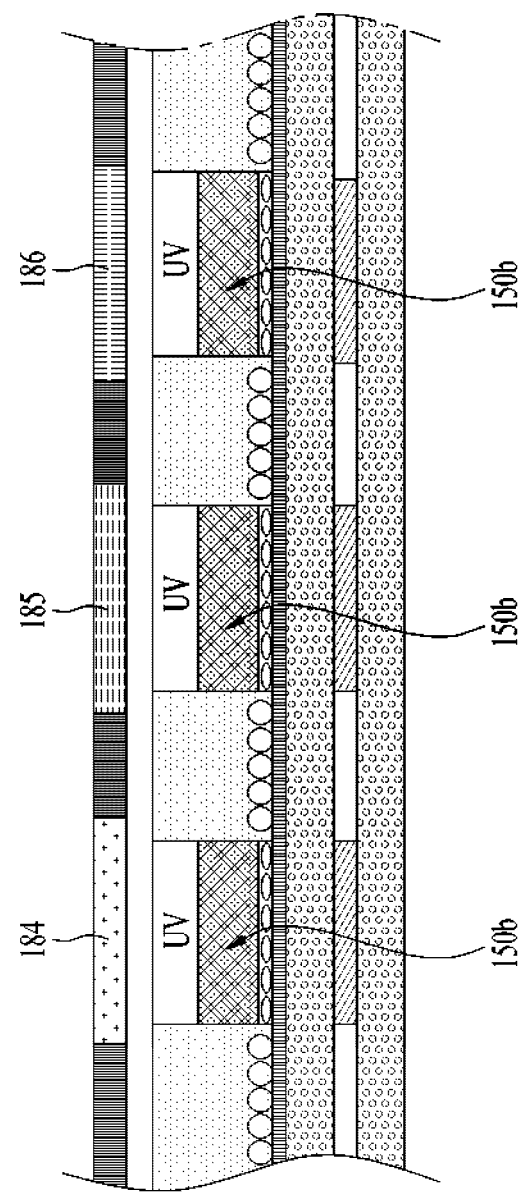

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 184, a green phosphor conversion layer 185, and a blue phosphor conversion layer 186 may be provided on an ultraviolet light emitting device. Not only visible light but also ultraviolet (UV) light may be used in the entire region of the semiconductor light emitting element 150b. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 µm or less, and the device may have a rectangular or square shape. When the semiconductor light emitting element has a rectangular shape, the size thereof may be less than or equal to 20 µm×80 µm.

In addition, even when a square semiconductor light emitting element having a side length of 10 µm is used as a unit pixel, sufficient brightness to form a display device may be obtained.

Therefore, for example, in case of a rectangular pixel having a unit pixel size of 600 µm×300 µm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
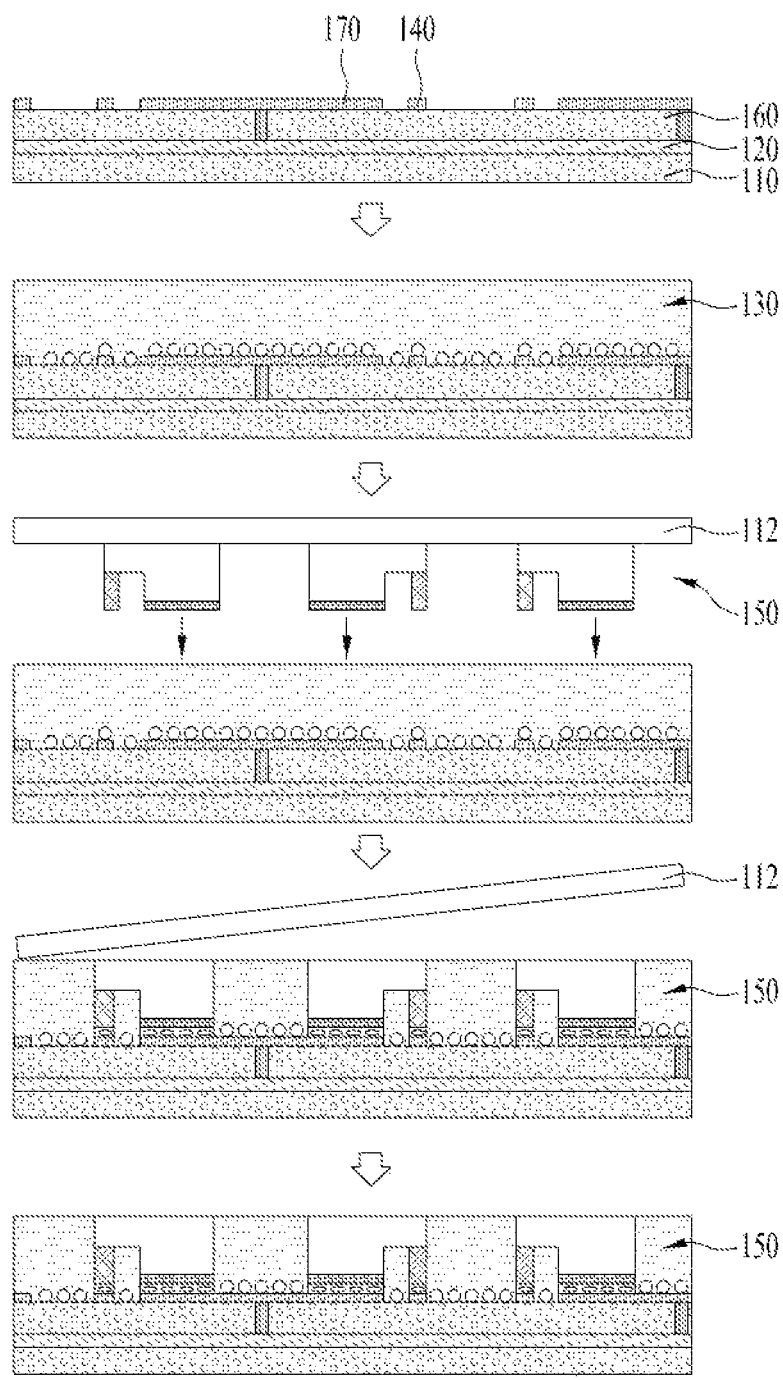
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical type semiconductor light emitting element.

Furthermore, a modification or embodiment described in the following may use the same or similar reference numbers for the same or similar configurations of the former example and the former description may apply thereto.

Figure 7:
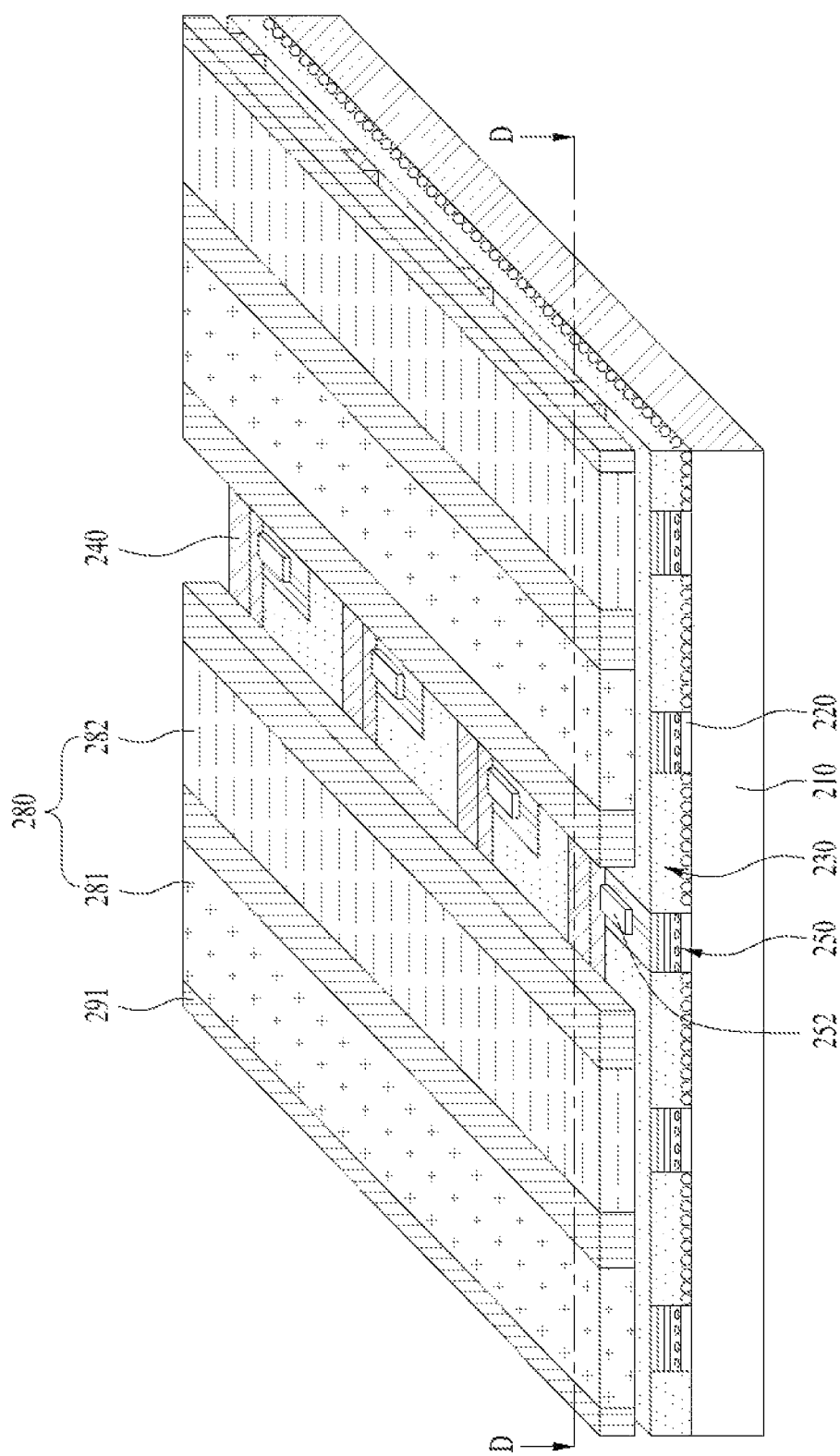
FIG. 7 is a perspective diagram of a display device using a semiconductor light emitting element according to another embodiment of the present disclosure.
Figure 8:
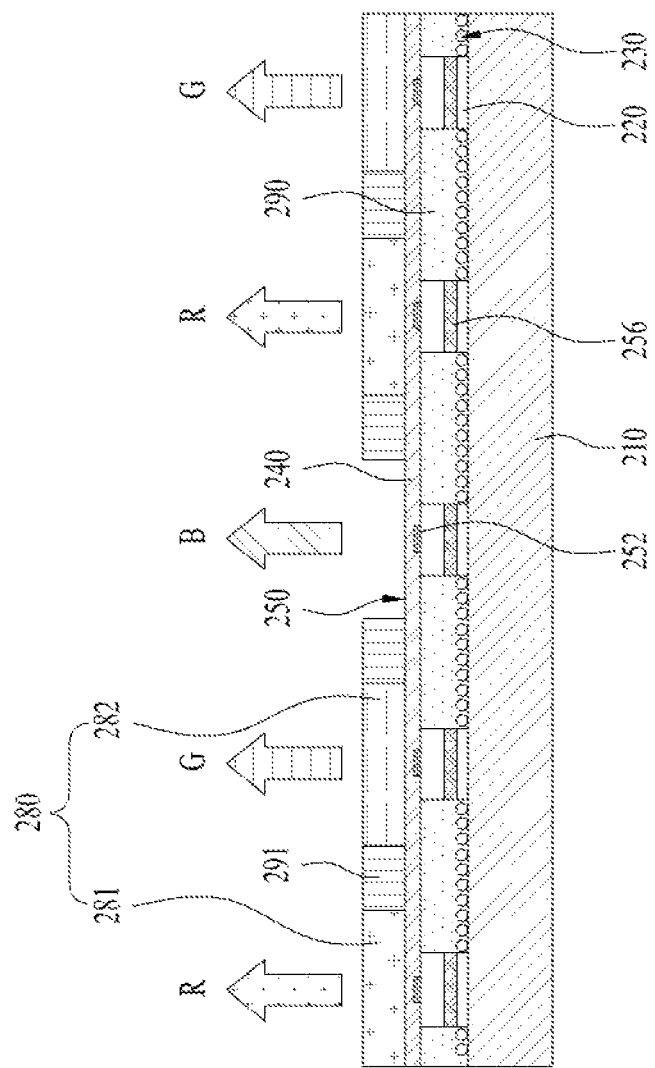
FIG. 8 is a cross-sectional diagram taken along a cutting line D-D shown in FIG. 7.
Figure 9:
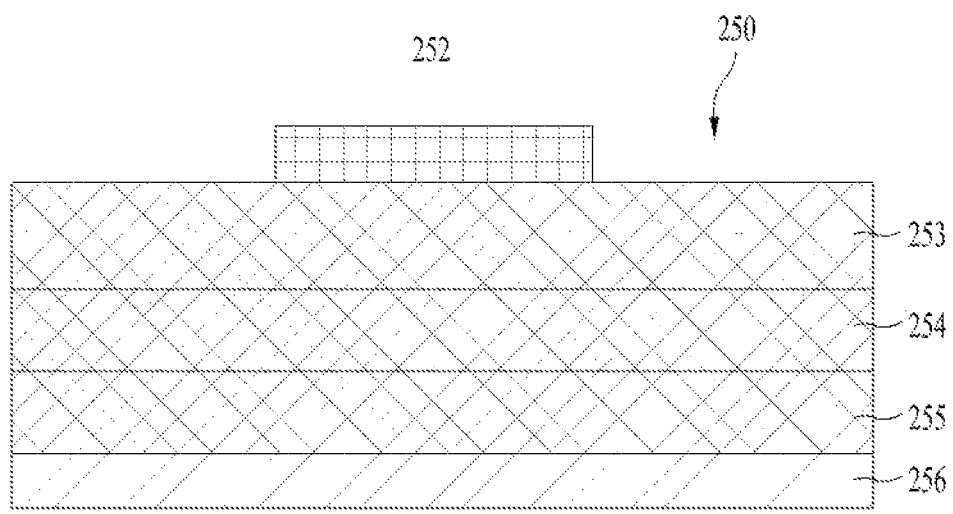
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 7, and FIG. 9 is a conceptual diagram showing a vertical type semiconductor light emitting element shown in FIG. 8.

Referring to the present drawings, a display device may employ a vertical type semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include an n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
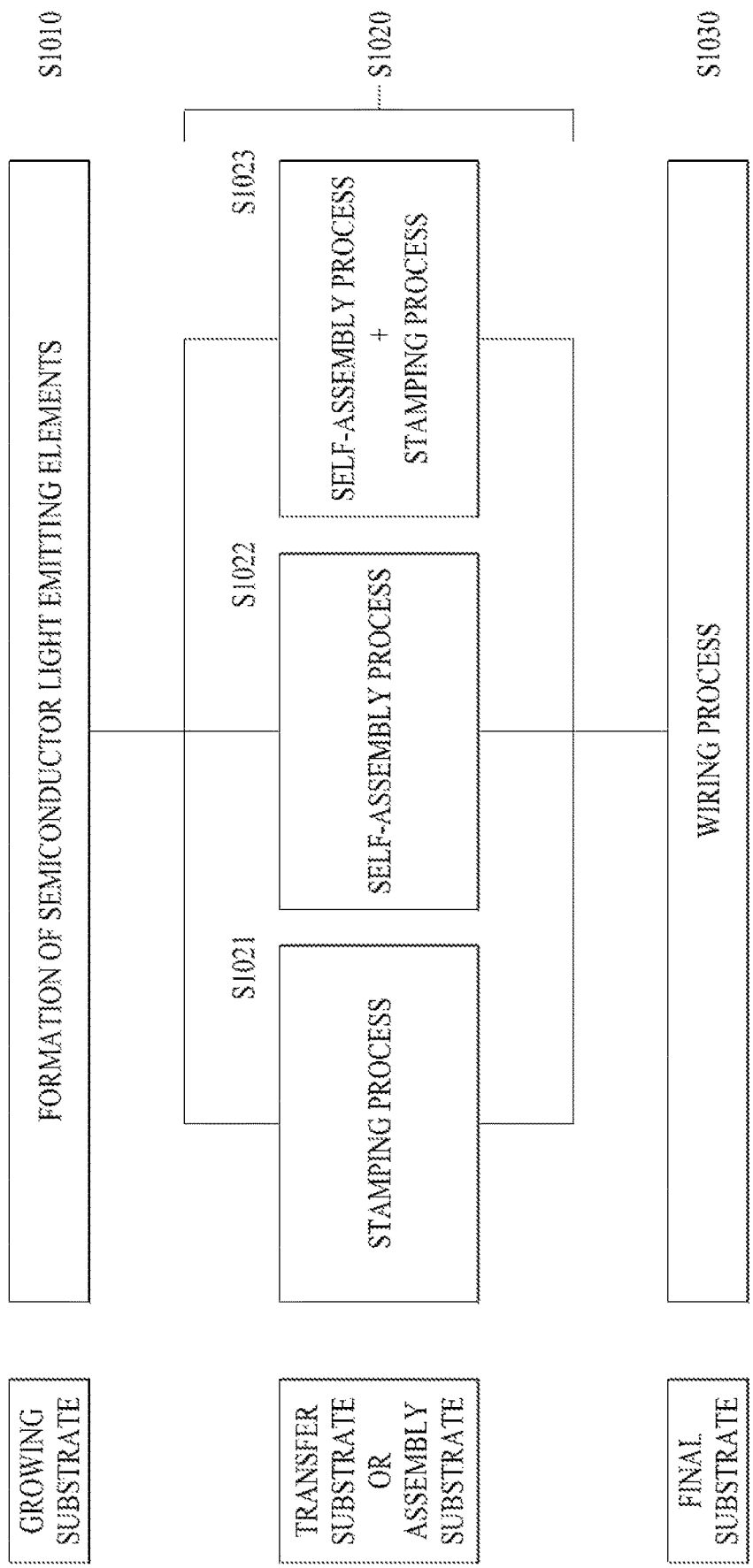
FIG. 10 is a flowchart schematically showing a method of manufacturing a display device using a semiconductor light emitting element.

FIG. 10 is a diagram schematically showing a method of manufacturing a display device using a semiconductor light emitting element.

First, semiconductor light emitting elements are formed on growth substrates (S1010). Each of the semiconductor light emitting elements may include a first conductivity-type semiconductor layer, an active layer, and a second conductivity-type semiconductor layer. In addition, a first conductivity-type electrode, which is formed on the first conductivity-type semiconductor layer, and a second conductivity-type electrode, which is formed on the second conductivity-type semiconductor layer, may be further included.

Either horizontal type semiconductor light emitting elements or vertical type semiconductor light emitting elements may be used as the semiconductor light emitting elements. However, when a vertical type semiconductor light emitting element is used, the first conductivity-type electrode and the second conductivity-type electrode face each other, and thus a process of separating the semiconductor light emitting element from the growth substrate and a subsequent process of forming a conductivity-type electrode in any one direction are performed. Further, as will be described later, the semiconductor light emitting element may include a magnetic layer for the purpose of a self-assembly process.

In order to apply the semiconductor light emitting elements to a display device, in general, three kinds of semiconductor light emitting elements, which respectively emit red (R), green (G), and blue (B) light, are necessary. Since semiconductor light emitting elements configured to emit light of one color are formed on one growth substrate, separate substrates are required to manufacture a display device that implements individual unit pixels using the above three kinds of semiconductor light emitting elements. Therefore, the individual semiconductor light emitting elements need to be separated from the growth substrates and then be assembled to or transferred to a final substrate. The final substrate is a substrate on which a process of forming wiring electrodes for applying voltage to the semiconductor light emitting elements in order to enable the semiconductor light emitting elements to emit light is performed.

Therefore, the semiconductor light emitting elements configured to emit light of respective colors may be primarily moved to a transfer substrate or an assembly substrate (S1020), and may be finally transferred to the final substrate. In some cases, when a wiring process is directly performed on the transfer substrate or the assembly substrate, the transfer substrate or the assembly substrate serves as the final substrate.

The semiconductor light emitting elements may be arranged on the transfer substrate or the assembly substrate through any of the following three methods (S1020).

The first method is to transfer the semiconductor light emitting elements from the growth substrate to the transfer substrate through a stamping process (S1021). The stamping process is a process of separating semiconductor light emitting elements from a growth substrate using a flexible substrate and adhesive protrusions formed on the flexible substrate. The semiconductor light emitting elements may be selectively separated from the growth substrate by adjusting the interval between the protrusions and the arrangement of the protrusions.

The second method is to assemble the semiconductor light emitting elements to the assembly substrate through a self-assembly process (S1022). In order to perform the self-assembly process, the semiconductor light emitting elements need to be separated from the growth substrate in order to be prepared individually, and thus a Laser Lift Off (LLO) process is performed a number of times equal to the number of semiconductor light emitting elements that are required in order to separate the semiconductor light emitting elements from the growth substrate. Thereafter, the semiconductor light emitting elements are dispersed in a fluid, and are assembled to the assembly substrate using an electromagnetic field.

In the self-assembly process, respective semiconductor light emitting elements configured to implement R, G, and B colors may be simultaneously assembled to one assembly substrate, or the semiconductor light emitting elements configured to implement respective colors may be assembled to respective assembly substrates.

The third method is to combine the stamping process and the self-assembly process (S1023). The semiconductor light emitting elements are first placed on the assembly substrate through the self-assembly process, and then are transferred to the final substrate through the stamping process. Since it is difficult to implement an assembly substrate having a large area due to the position of the assembly substrate, contact with the fluid, and the influence of the electromagnetic field during the self-assembly process, the semiconductor light emitting elements may be assembled to an assembly substrate having an appropriate area, and may then be transferred multiple times to the final substrate, having a large area, through the stamping process.

When the plurality of semiconductor light emitting elements constituting respective unit pixels is disposed on the final substrate, a wiring process is performed in order to electrically interconnect the semiconductor light emitting elements (S1030).

Wiring electrodes formed through the wiring process electrically connect the semiconductor light emitting elements, assembled to or transferred to the substrate, to the substrate. Further, transistors for driving an active matrix may be formed in advance on the lower surface of the substrate. Thereby, the wiring electrodes may be electrically connected to the transistors.

In order to implement a large-scale display device, a large number of semiconductor light emitting elements is required, and thus a self-assembly process is desirable. Further, in order to increase the assembly speed, simultaneous assembly of the semiconductor light emitting elements configured to implement respective colors to one assembly substrate may be preferred during the self-assembly process. Further, in order to assemble the semiconductor light emitting elements configured to implement respective colors at predetermined specific positions on the assembly substrate, the semiconductor light emitting elements may be required to have mutually different structures.

Figure 11:
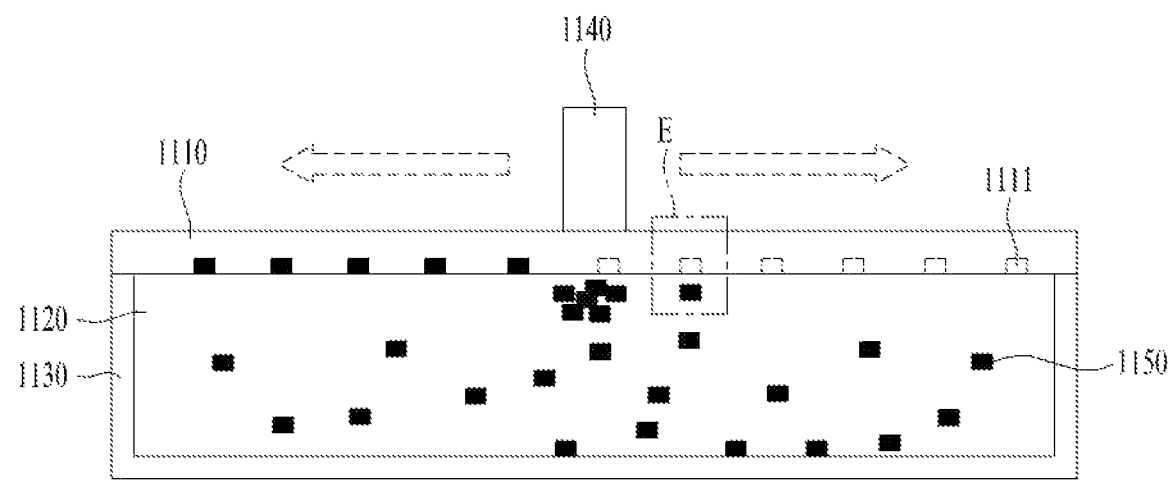
FIG. 11 is a diagram showing one embodiment of a method of assembling semiconductor light emitting elements to a substrate through a self-assembly process.

FIG. 11 is a diagram showing one embodiment of a method of assembling semiconductor light emitting elements to a substrate through the self-assembly process.

Figure 12:
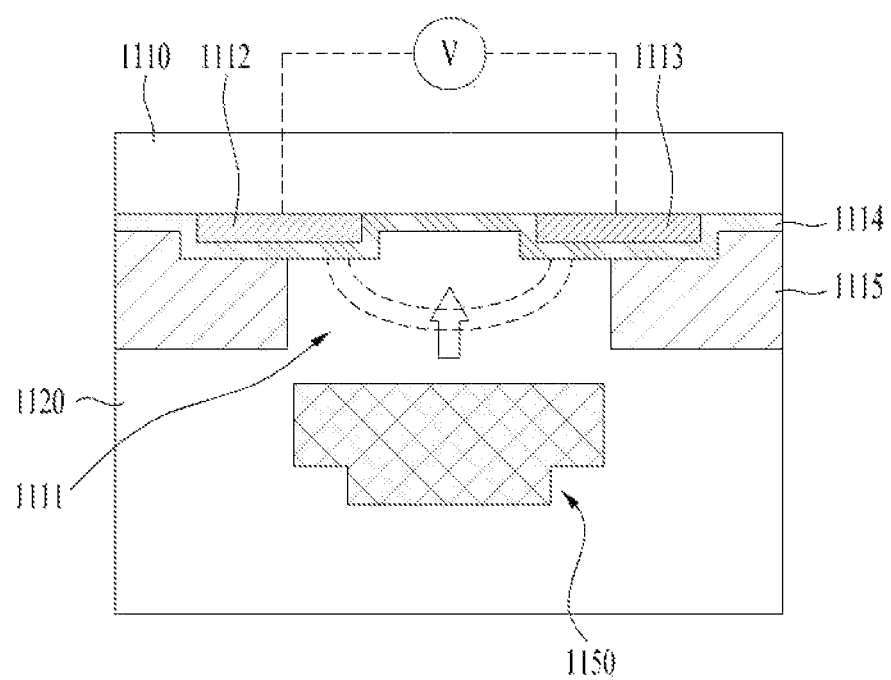
FIG. 12 is an enlarged diagram of a part E in FIG. 11.

FIG. 12 is an enlarged diagram of a part E in FIG. 11.

Referring to FIGS. 11 and 12, semiconductor light emitting elements 1150 may be put into a chamber 1130 filled with a fluid 1120.

Thereafter, an assembly substrate 1110 may be placed on the chamber 1130. In some embodiments, the assembly substrate 1110 may be put into the chamber 1130. In this case, the assembly substrate 1110 is put into the chamber 1130 in the direction in which assembly recesses 1111 in the assembly substrate 1110 face the fluid 1120.

A pair of electrodes 1112 and 1113 corresponding to each of the semiconductor light emitting elements 1150 to be assembled to the assembly substrate 1110 may be formed on the assembly substrate 1110. The electrodes 1112 and 1113 may be implemented as transparent electrodes (formed of ITO), or may be formed of other general materials. The electrodes 1112 and 1113 correspond to assembly electrodes that generate an electric field upon application of voltage thereto and thus stably fix the semiconductor light emitting elements 1150 brought into contact with the assembly recesses 1112 and 1113.

Specifically, AC voltage may be applied to the electrodes 1112 and 1113, and the semiconductor light emitting element 1150, which floats around the electrodes 1112 and 1113, may be imparted with polarity due to dielectric polarization. Further, the dielectrically polarized semiconductor light emitting element may be moved in a specific direction, or may be fixed by a non-uniform electric field formed around the electrodes 1112 and 1113. This may be referred to as dielectrophoresis (DEP) and, during the self-assembly process according to the present disclosure, the semiconductor light emitting elements 1150 may be stably fixed to the assembly recesses 1111 using dielectrophoresis. The intensity of dielectrophoresis (DEP force) is proportional to the intensity of an electric field, and thus varies depending on the extent of dielectric polarization in the semiconductor light emitting elements.

Further, the distance between the assembly electrodes 1112 and 1113 may be less than, for example, the width of the semiconductor light emitting elements 1150 and the diameter of the assembly recesses 1111, thereby enabling the semiconductor light emitting elements 1150 to be more precisely fixed at the assembly positions thereof using an electric field.

Further, an insulating layer 1114 may be formed on the assembly electrodes 1112 and 1113 in order to protect the electrodes 1112 and 1113 from the fluid 1120 and to prevent leakage of current flowing through the assembly electrodes 1112 and 1113. For example, the insulating layer 1114 may be formed in a single-layer structure or a multilayer structure using an inorganic insulator, such as silica or alumina, or an organic insulator. Further, the insulating layer 1114 may have a minimum thickness to prevent damage to the assembly electrodes 1112 and 1113 when the semiconductor light emitting elements 1150 are assembled to the assembly electrodes 1112 and 1113, and may have a maximum thickness to stably assemble the semiconductor light emitting elements 1150.

A partition wall 1115 may be formed on the insulting layer 1114. Some regions of the partition wall 1115 may be located on the assembly electrodes 1112 and 1113, and remaining regions may be located on the assembly substrate 1110.

For example, when the assembly substrate 1110 is manufactured, the assembly recesses 1111 through which the respective semiconductor light emitting elements 1150 are coupled to the assembly substrate 1110 may be formed by removing some parts of the partition wall formed on the entire surface of the insulating layer 1114.

As shown in FIG. 12, the assembly recesses 1111 to which the semiconductor light emitting elements 1150 are coupled may be formed in the assembly substrate 1110, and the surface of the assembly substrate 1110 in which the assembly recesses 1111 are formed may be in contact with the fluid 1120. The assembly recesses 1111 may accurately guide the semiconductor light emitting elements 1150 to the assembly positions thereof.

Further, the partition wall 1115 may be formed to have a designated inclination in a direction from the opening in the assembly recess 1111 to the bottom surface of the assembly recess 1111. For example, the assembly recess 1111 may have the opening and the bottom surface, and the area of the opening may be formed to be greater than the area of the bottom surface by adjusting the inclination of the partition wall 1115. Thereby, the semiconductor light emitting element 1150 may be accurately placed in position in the bottom surface of the assembly recess 1111.

The assembly recess 1111 may have a shape and a size corresponding to the shape of the semiconductor light emitting element 1150 to be assembled thereto. Accordingly, it may be possible to prevent another semiconductor light emitting element or a plurality of semiconductor light emitting elements from being assembled to the corresponding assembly recess 1111.

Further, the depth of the assembly recesses 1111 may be formed to be less than the vertical height of the semiconductor light emitting elements 1150. Therefore, the semiconductor light emitting elements 1150 may protrude above the partition wall 1115, and may thus easily come into contact with protrusions of a transfer substrate during a transfer process, which may be performed after assembly.

Further, after the assembly substrate 1110 is disposed, as shown in FIG. 12, an assembly device 1140 including a magnetic body may move along the assembly substrate 1110. The assembly device 1140 may move in the state in which the assembly device 1140 is in contact with the assembly substrate 1110 in order to maximize the range within which a magnetic field acts on the fluid 1120. For example, the assembly device 1140 may include a plurality of magnetic bodies, or may include a magnetic body having a size corresponding to the size of the assembly substrate 1110. In this case, the distance that the assembly device 1140 is capable of moving may be restricted to within a designated range.

The semiconductor light emitting elements 1150 in the chamber 1130 may be moved toward the assembly device 1140 by the magnetic field generated by the assembly device 1140.

When the semiconductor light emitting elements 1150 move toward the assembly device 1140, the semiconductor light emitting elements 1150 may enter the assembly recesses 1111 and come into contact with the assembly substrate 1110, as shown in FIG. 12.

Further, the semiconductor light emitting elements 1150 may include a magnetic layer formed therein so as to perform the self-assembly process.

Further, due to the electric field generated by the assembly electrodes 1112 and 1113 of the assembly substrate 1110, the semiconductor light emitting elements 1150 that are in contact with the assembly substrate 1110 may be prevented from being released by movement of the assembly device 1140.

Therefore, the plurality of semiconductor light emitting elements 1150 may be simultaneously assembled to the assembly substrate 1110 through the self-assembly method using an electromagnetic field, as shown in FIGS. 11 and 12.

Figure 13:
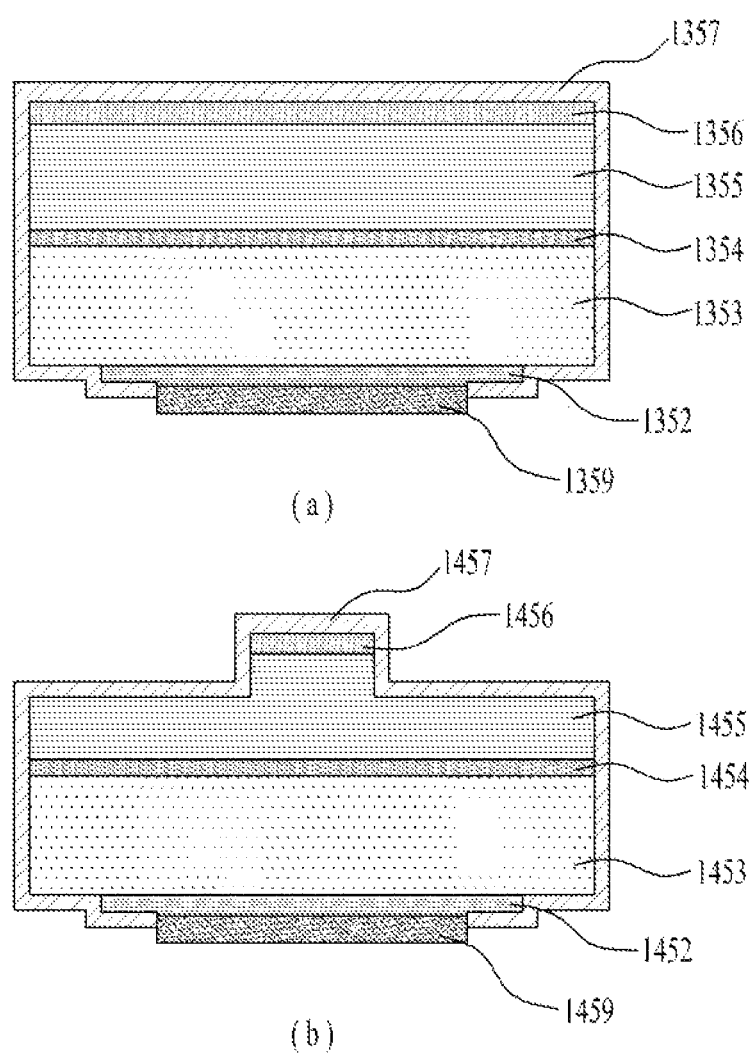
FIG. 13 illustrates embodiments of a vertical type semiconductor light emitting element configured to be self-assembled in a fluid.

FIG. 13 illustrates embodiments of a vertical type semiconductor light emitting element configured to be self-assembled in a fluid.

In the case of a horizontal type semiconductor light emitting element, all of conductivity-type electrodes configured to be connected to respective conductivity-type semiconductor layers are formed on one surface of the element, and thus the process of manufacturing the horizontal type semiconductor light emitting element is relatively easy. However, the number of horizontal type semiconductor light emitting elements that can be manufactured using a growth substrate having a given area is less than the number of vertical type semiconductor light emitting elements. Therefore, it is advantageous in terms of manufacturing costs to use vertical type semiconductor light emitting elements in a display device that uses millions of semiconductor light emitting elements or more.

Meanwhile, in order to assemble vertical type semiconductor light emitting elements to the assembly substrate, a separate wiring electrode needs to be provided underneath the assembly recess in the assembly substrate. The wiring electrode may be electrically connected to a conductivity-type electrode layer located at one end of the vertical type semiconductor light emitting element.

First, FIG. 13(a) is a diagram showing the shape of a general vertical type semiconductor light emitting element. A first conductivity-type semiconductor layer 1353, an active layer 1354, and a second conductivity-type semiconductor layer 1355 form a stacked structure. A first conductivity-type electrode layer 1352 is formed under the first conductivity-type semiconductor layer 1353, and a second conductivity-type electrode layer 1356 is formed on the second conductivity-type semiconductor layer 1355. In addition, a passivation layer 1357 for protecting the semiconductor light emitting element from the external environment surrounds the outer portion of the element, and a conductive adhesive layer 1359 is electrically connected to the first conductivity-type electrode layer 1352 in a region where the passivation layer is not formed. The conductive adhesive layer 1359 is provided for electrical connection with the wiring electrode formed on the assembly substrate, and a metal layer having a low melting point of 250 degrees Celsius or lower may be mainly used as the conductive adhesive layer. Because a low-melting-point metal layer is used, it may be possible to implement a reliable electrical connection between the semiconductor light emitting element and the substrate by heating the substrate after assembly of the element. Further, the second conductivity-type electrode layer 1356 may be a transparent electrode layer made of, for example, ITO.

Meanwhile, it is difficult to use the vertical type semiconductor light emitting element having the structure shown in FIG. 13(a) in the self-assembly process shown in FIGS. 11 and 12. As described above, the semiconductor light emitting element in the fluid may be brought into contact with the assembly recess in the assembly substrate by a magnetic field, and may be assembled to the assembly recess by dielectrophoretic force through the assembly electrode. The dielectrophoretic force is proportional to the distance between the assembly electrode and the semiconductor light emitting element, and is proportional to area for a given distance. That is, in order to assemble the semiconductor light emitting elements in a designated direction in the fluid, it is desirable for the surface of the semiconductor light emitting element that is to be assembled to the assembly substrate to have a larger area than the other surfaces thereof.

Therefore, the semiconductor light emitting element shown in FIG. 13(a) is highly likely to be assembled to the assembly substrate in a random direction, rather than in a designated direction. In general, when a semiconductor light emitting element is formed, the thickness of the conductivity-type electrode layer and the thickness of the passivation layer are formed to be very small compared to the thickness of the conductivity-type semiconductor layer. Accordingly, the change in the area of the upper surface or the lower surface of the semiconductor light emitting element due to the formation of the conductivity-type electrode layer and the passivation layer is not large. Therefore, assuming that dielectrophoretic force generated by an electric field acts on the semiconductor light emitting element shown in FIG. 13(a), it is difficult to assemble the semiconductor light emitting element to the assembly substrate in a designated direction, because the areas of the upper and lower surfaces of the semiconductor light emitting element are similar to each other. The thickness of the conductive adhesive layer 1359 may be increased in order to cause a difference in area, but in this case, the surface of the semiconductor light emitting element that is opposite the conductive adhesive layer 1359 is assembled to the assembly substrate, and thus it is difficult to implement an electrical connection with the wiring electrode formed on the assembly substrate.

Therefore, in the case of a vertical type semiconductor light emitting element, the assembly surface thereof needs to have a larger area than other surfaces thereof, and it is desirable to form a low-melting-point adhesive layer on the assembly surface thereof.

FIG. 13(b) is a cross-sectional diagram showing a semiconductor light emitting element capable of being assembled in a designated direction in the fluid, which is manufactured in view of the problem with the case shown in FIG. 13(a).

A first conductivity-type semiconductor layer 1453, an active layer 1454, and a second conductivity-type semiconductor layer 1455 form a stacked structure. A first conductivity-type electrode layer 1452 is formed under the first conductivity-type semiconductor layer 1455, and a second conductivity-type electrode layer 1456 is formed on the second conductivity-type semiconductor layer 1455. In addition, a passivation layer 1457 for protecting the semiconductor light emitting element from the external environment surrounds the outer portion of the element, and a conductive adhesive layer 1459 is electrically connected to the first conductivity-type electrode layer 1452 in a region where the passivation layer is not formed. The conductive adhesive layer 1459 is provided for electrical connection with the wiring electrode formed on the assembly substrate, and a metal layer having a low melting point of 250 degrees Celsius or lower may be mainly used as the conductive adhesive layer. Because a low-melting-point metal layer is used, it may be possible to implement a reliable electrical connection between the semiconductor light emitting element and the substrate by heating the substrate after assembly of the element. Further, the second conductivity-type electrode layer 1456 may be a transparent electrode layer made of, for example, ITO.

In the case shown in FIG. 13(b), a mesa structure is formed by etching some regions of the second conductivity-type semiconductor layer 1455 in order to define an assembly surface of the semiconductor light emitting element to be assembled to the substrate in the fluid, thereby generating a difference in area between the two ends of the semiconductor light emitting element.

As shown in FIG. 13(b), due to the mesa structure of the second conductivity-type semiconductor layer 1455, the area of the surface on which the conductivity-type electrode layer 1456 is located is smaller than the area of the surface on which the conductive adhesive layer 1459 is formed. Therefore, the surface of the semiconductor light emitting element on which the conductive adhesive layer 1459 is formed may be assembled to the substrate.

However, in the case of the semiconductor light emitting element shown in FIG. 13(*b*), most of the light is radiated from the region in which the conductivity-type electrode layer 1456 is formed on the upper surface of the mesa structure, which may be disadvantageous in terms of luminous efficiency. In addition, since the area of the conductive adhesive layer 1459 is smaller than the area of the conductivity-type electrode 1452, luminous efficiency may deteriorate due to open defects or high contact resistance in a subsequent process for bonding the element to the substrate after assembly.

Therefore, the present disclosure has been made in view of the above problems, and a vertical type semiconductor light emitting element having a new structure capable of being assembled in a designated direction in a fluid and of improving luminous efficiency will be described below with reference to FIGS. 14 to 23.

Figure 14:
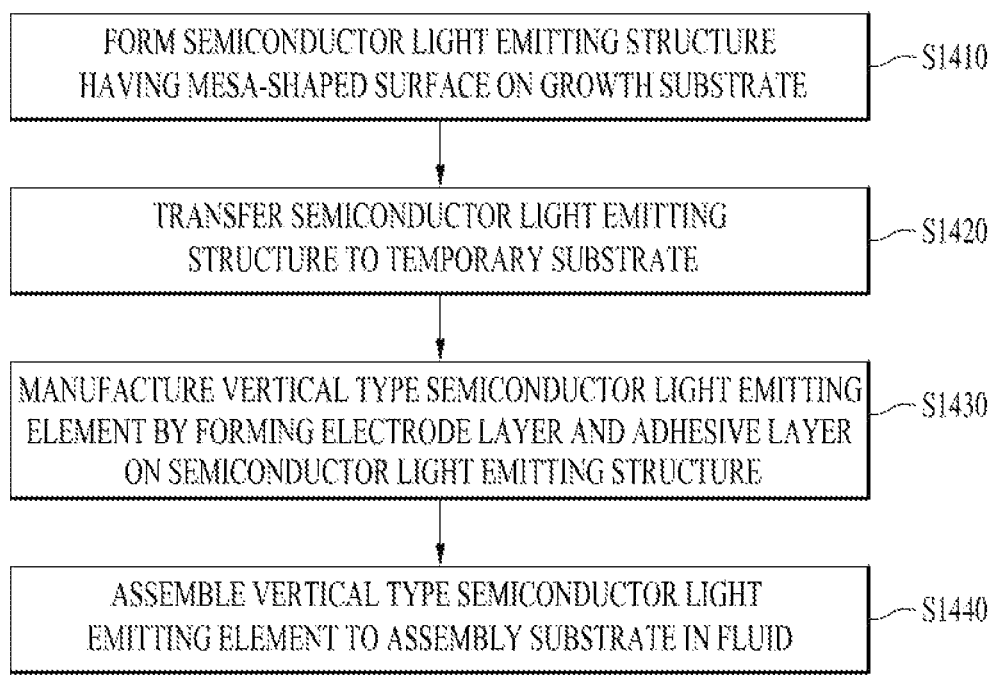
FIG. 14 is a flowchart showing a method of manufacturing a semiconductor light emitting element according to the present disclosure.

FIG. 14 is a flowchart showing a method of manufacturing a semiconductor light emitting element according to the present disclosure.

First, a semiconductor light emitting structure having a mesa-shaped surface is formed on a growth substrate (S1410). As will be described later, in this case, the semiconductor light emitting structure is a structure in which a first conductivity-type electrode layer, a conductive adhesive layer, and a second passivation layer are not provided, which will be included in a final semiconductor light emitting element.

Thereafter, the semiconductor light emitting structure is transferred to a temporary substrate (S1420). The interface of the semiconductor light emitting structure that is in contact with the growth substrate may be exposed through the transfer step S1420.

Thereafter, an electrode layer and a conductive adhesive layer are formed in the semiconductor light emitting structure to complete the manufacture of a vertical type semiconductor light emitting element (S1430). The electrode layer is formed on the interface of the semiconductor light emitting structure that is exposed through the transfer step S1420. Additionally, a second passivation layer may be formed between the electrode layer and the conductive adhesive layer.

Finally, the manufactured vertical type semiconductor light emitting element is assembled to an assembly substrate in a fluid using an electric field and a magnetic field (S1440).

It will be apparent to those skilled in the art that omission of or changes in some steps in the flowchart shown in FIG. 14 falls within the scope of the present disclosure, in consideration of the overall gist of the present disclosure.

Figure 15:
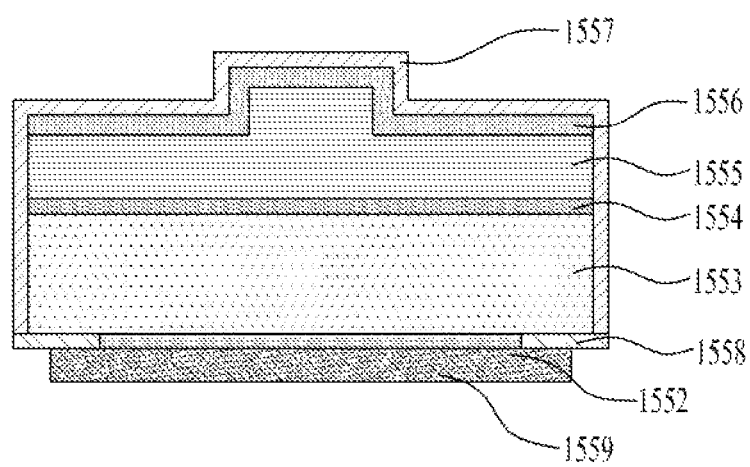
FIGS. 15 and 16 are diagrams specifically showing the structure of the semiconductor light emitting element according to the present disclosure.
Figure 16:
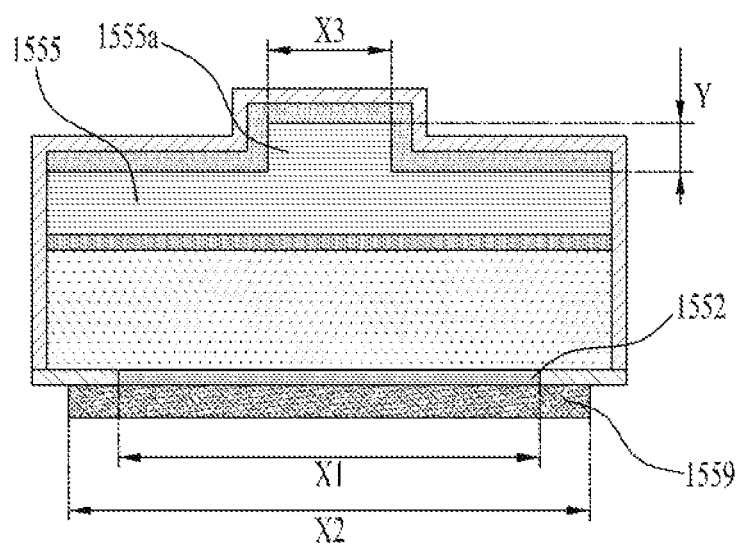

FIGS. 15 and 16 are diagrams specifically showing the structure of the semiconductor light emitting element according to the present disclosure.

As shown in FIG. 15, a first conductivity-type semiconductor layer 1553, an active layer 1554, and a second conductivity-type semiconductor layer 1555 form a stacked structure. A first conductivity-type electrode layer 1552 is formed under the first conductivity-type semiconductor layer 1555, and a second conductivity-type electrode layer 1556 is formed on the second conductivity-type semiconductor layer 1555. In addition, in order to protect the semiconductor light emitting element from the external environment, a first passivation layer 1557 surrounds the top surface and the side surface of the element, and a second passivation layer 1558 surrounds a portion of the lower surface of the element. In addition, a conductive adhesive layer 1559, which overlaps a portion of the second passivation layer 1558, is electrically connected to the first conductivity-type electrode layer 1552. The first passivation layer 1557 and the second passivation layer 1558 may be formed of the same material as each other.

The structural difference between the vertical type semiconductor light emitting element shown in FIG. 13(*b*) and the semiconductor light emitting element shown in FIG. 15 will be described. First, the second conductivity-type electrode layer 1556 shown in FIG. 15 is located on the entire area of the upper surface of the second conductivity-type semiconductor layer 1555, having a mesa structure. Accordingly, the semiconductor light emitting area increases, thus leading to improved luminous efficiency.

In addition, after transfer, the second passivation layer 1558 is formed prior to formation of the conductive adhesive layer 1559 on the temporary substrate, and thus the conductive adhesive layer 1559 sufficiently surrounds the first conductivity-type electrode layer 1552, thereby reducing contact resistance.

Numerically confirming the structural difference, as shown in FIG. 16, the width X1 of the first conductivity-type electrode layer 1552 may be smaller than or equal to the width X2 of the conductive adhesive layer 1559. In addition, the width X1 of the first conductivity-type electrode layer 1552 needs to be larger than the width X3 of the upper surface of the mesa structure 1555*a* formed on the second conductivity-type semiconductor layer 1555. Since the width difference is proportional to the area difference, it can be considered that the area of the conductive adhesive layer 1559 of the semiconductor light emitting element is larger than the area of the mesa structure. Therefore, when the semiconductor light emitting element is assembled to the assembly substrate, the surface of the semiconductor light emitting element on which the conductive adhesive layer 1559 is formed may be seated in the assembly recess in the assembly substrate.

In addition, the height Y of the mesa structure 1555*a* is preferably equal to or greater than the effective distance of the dielectrophoretic force applied to the semiconductor light emitting element by the assembly substrate. For example, it was experimentally confirmed that the range within which dielectrophoretic force acts on a circular-shaped semiconductor light emitting element having a width of 50 μm and a height of 10 μm was around 200 nm. Therefore, if the height Y of the mesa structure 1555*a* is greater than 200 nm, the dielectrophoretic force will act only on the upper surface of the mesa structure 1555*a*, but if the height Y of the mesa structure 1555*a* is equal to or less than 100 nm, the dielectrophoretic force will act on the entire area of the surface of the second conductivity-type semiconductor layer 1555, which includes the mesa structure 1555*a*. That is, it is difficult to realize a large difference from the area of the conductive adhesive layer 1559, which corresponds to the opposite surface of the second conductivity-type semiconductor layer 1555. Therefore, if the height Y of the mesa structure 1555*a* is greater than 200 nm, the semiconductor light emitting element will be assembled in the direction in which the conductive adhesive layer 1559 is oriented, but if the height Y of the mesa structure 1555*a* is equal to or less than 200 nm (e.g. 100 nm), it is difficult to ensure the direction in which the semiconductor light emitting element is assembled.

Figure 17:
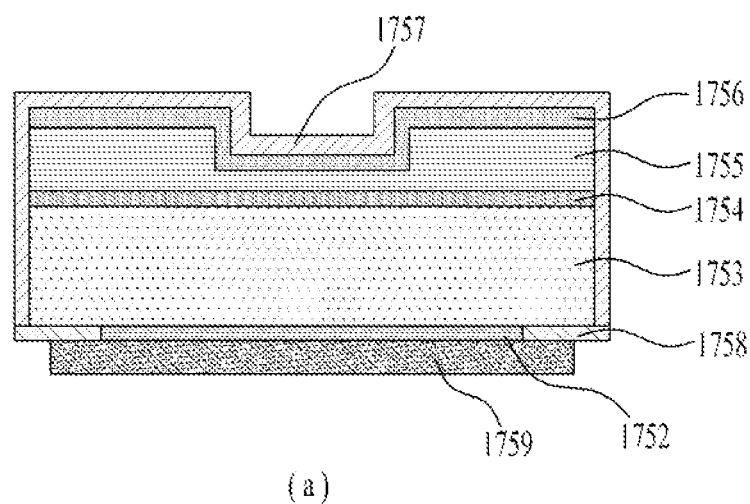
FIG. 17 illustrates other embodiments of the semiconductor light emitting element according to the present disclosure.
Figure 17:
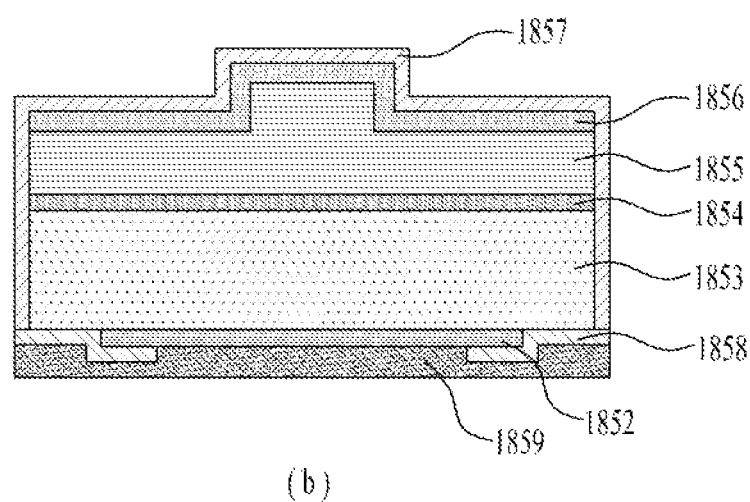

FIG. 17 illustrates other embodiments of the semiconductor light emitting element according to the present disclosure.

As described above, the semiconductor light emitting element of the present disclosure is characterized in that the second conductivity-type electrode layer is formed on the upper surface of the second conductivity-type semiconductor layer, which includes the mesa structure, and in that the conductive adhesive layer is formed to be wider than the first conductivity-type electrode layer. Therefore, various other embodiments of the semiconductor light emitting element are possible, so long as the above characteristics are satisfied.

For example, as shown in FIG. 17(a), a semiconductor light emitting element having two mesa structures may be manufactured. In the semiconductor light emitting element, a first conductivity-type semiconductor layer 1753, an active layer 1754, and a second conductivity-type semiconductor layer 1755 form a stacked structure. A first conductivity-type electrode layer 1752 is formed under the first conductivity-type semiconductor layer 1753, and a second conductivity-type electrode layer 1756 is formed on the entire upper portion of the second conductivity-type semiconductor layer 1755. In addition, in order to protect the semiconductor light emitting element from the external environment, a first passivation layer 1757 surrounds the upper surface and the side surface of the element, and the second passivation layer 1758 surrounds a portion of the lower surface of the element. In addition, a conductive adhesive layer 1759, which overlaps the second passivation layer 1758, is electrically connected to the first conductivity-type electrode layer 1752.

When a semiconductor light emitting structure is formed on a growth substrate, a plurality of mesa structures may be provided on one surface of the semiconductor light emitting structure through a relatively simple process (a photo process and an etching process). However, in order to realize unidirectional assembly with the assembly substrate, the sum of the areas of the upper surfaces of the plurality of mesa structures needs to be smaller than the area of the conductive adhesive layer 1759, which is the surface opposite thereto.

Further, as shown in FIG. 17(b), in a semiconductor light emitting element according to another embodiment, a first conductivity-type semiconductor layer 1853, an active layer 1854, a second conductivity-type semiconductor layer 1855, and a second conductivity-type electrode layer 1856 may have shapes similar to those of the semiconductor light emitting element shown in FIG. 15, but a second passivation layer 1858, which overlaps a conductive adhesive layer 1859, may have a shape different from that of the semiconductor light emitting element shown in FIG. 15. For example, the element shown in FIG. 17(a) may be configured such that the second passivation layer 1758 is formed only between the conductive adhesive layer 1759 and the first conductivity-type semiconductor layer 1753, whereas the element shown in FIG. 17(b) may be configured such that some regions of the second passivation layer 1758 are formed between the first conductivity-type electrode layer 1852 and the conductive adhesive layer 1859. In addition, the width of the conductive adhesive layer 1859 may be formed to be equal to the width of the side surface of the element including the first passivation layer 1857.

The reason why this shape is obtained is that the first conductivity-type electrode layer 1852, the second passivation layer 1858, and the conductive adhesive layer 1859 are formed on a temporary substrate through additional processes. The above shape may vary depending on the processing order and conditions.

Therefore, the structure of the semiconductor light emitting element of the present disclosure is not limited to the embodiments shown in FIG. 17.

Figure 18:
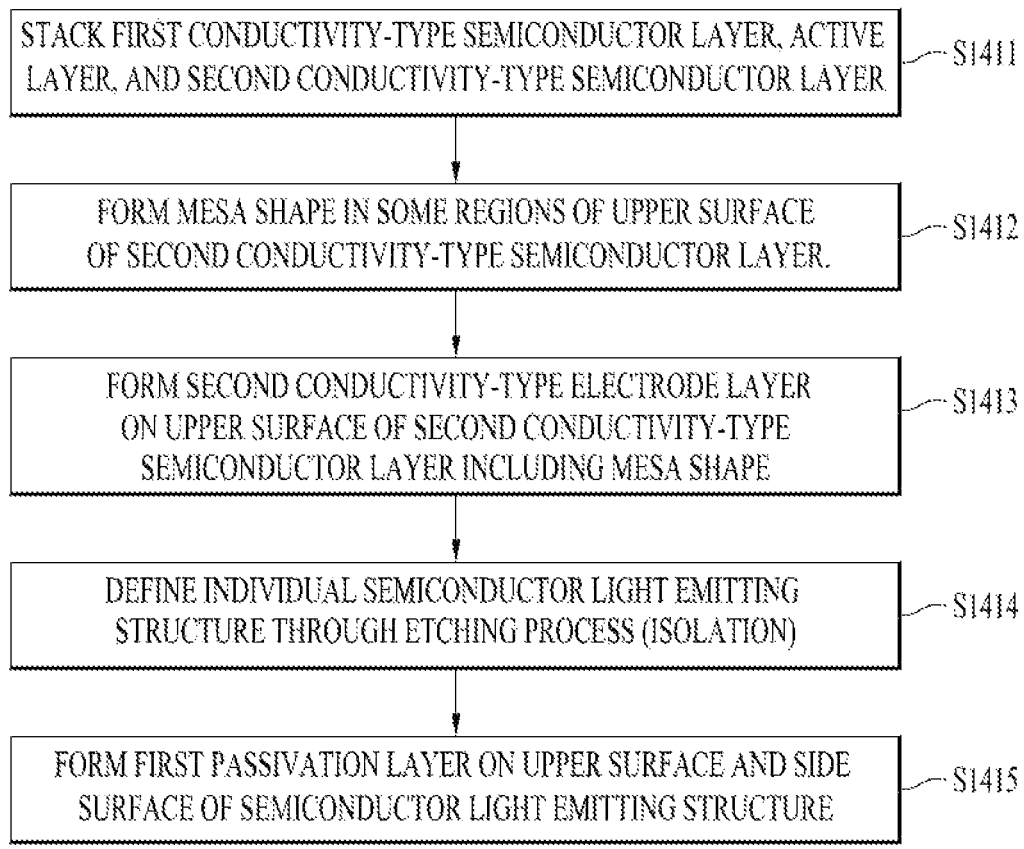
FIG. 18 is a flowchart showing a process of forming a semiconductor light emitting structure having a mesa shape on one surface thereof.

FIG. 18 is a flowchart showing a process of forming a semiconductor light emitting structure having a mesa shape on one surface thereof.

First, a first conductivity-type semiconductor layer, an active layer, and a second conductivity-type semiconductor layer are stacked (S1411). Thereafter, some regions of the upper surface of the second conductivity-type semiconductor layer are etched to form a mesa shape (S1412). Thereafter, a second conductivity-type electrode layer is formed on the upper surface of the second conductivity-type semiconductor layer including the mesa shape (S1413), and isolation is performed so that individual semiconductor light emitting structures are defined through an etching process (S1414). Finally, a first passivation layer is formed on the upper surface and the side surface of the semiconductor light emitting structure (S1415).

It will be apparent to those skilled in the art that omission of or changes in some steps in the flowchart shown in FIG. 18 falls within the scope of the present disclosure, in consideration of the overall gist of the present disclosure.

Figure 19:
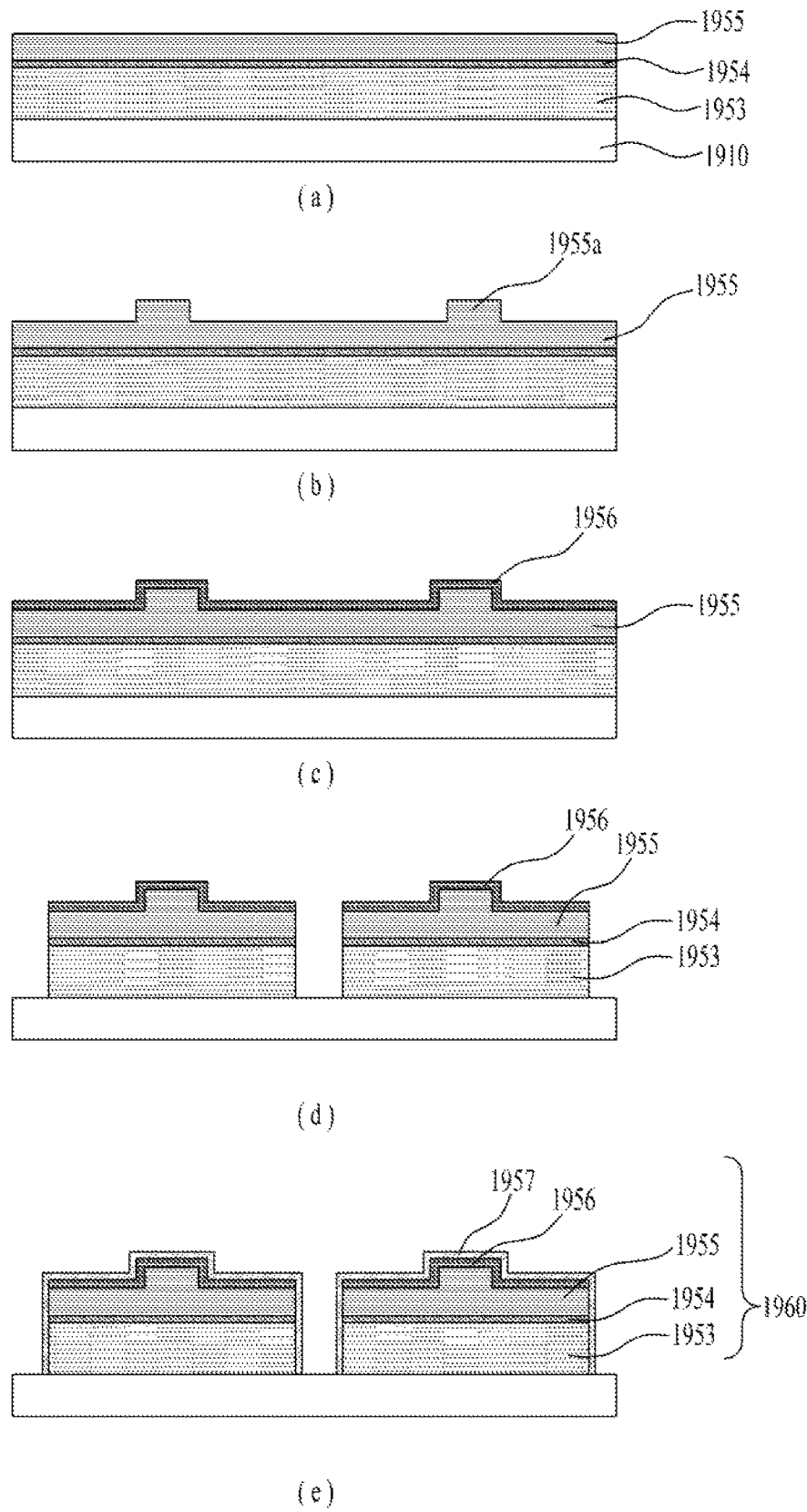
FIG. 19 illustrates cross-sectional diagrams for explaining the formation process shown in FIG. 18.

FIG. 19 illustrates cross-sectional diagrams for explaining a process of forming the semiconductor light emitting structure shown in FIG. 18.

As shown in FIG. 19(a), a first conductivity-type semiconductor layer 1953, an active layer 1954, and a second conductivity-type semiconductor layer 19551 are first stacked on a growth substrate 1910.

Thereafter, as shown in FIG. 19(b), some regions of the upper surface of the second conductivity-type semiconductor layer 1955 are etched to form a mesa shape 1955a. In this case, the etching may be performed such that the height of the mesa shape 1955a is equal to or greater than an effective distance within which dielectrophoretic force acts in a subsequent assembly process.

Thereafter, as shown in FIG. 19(c), a second conductivity-type electrode layer 1956 is formed on the entire area of the upper surface of the second conductivity-type semiconductor layer including the mesa shape. In this case, the second conductivity-type electrode layer 1956 may be a transparent electrode layer formed of, for example, ITO, and may be formed to have a very small thickness so as to be capable of being removed through an etching process.

Thereafter, isolation is performed so that individual semiconductor light emitting structures are defined through an etching process.

Finally, as shown in FIG. 19(e), a first passivation layer 1957 is formed on the upper surface and the side surface of the isolated semiconductor light emitting structure (S1415). Therefore, as shown in FIG. 19(e), a final semiconductor light emitting structure 1960 is formed such that the first conductivity-type semiconductor layer 1953, the active layer 1954, the second conductivity-type semiconductor layer 1955 having the mesa shape, and the second conductivity-type electrode layer 1956 are stacked and such that the first passivation layer 1957 surrounds the above components.

Figure 20:
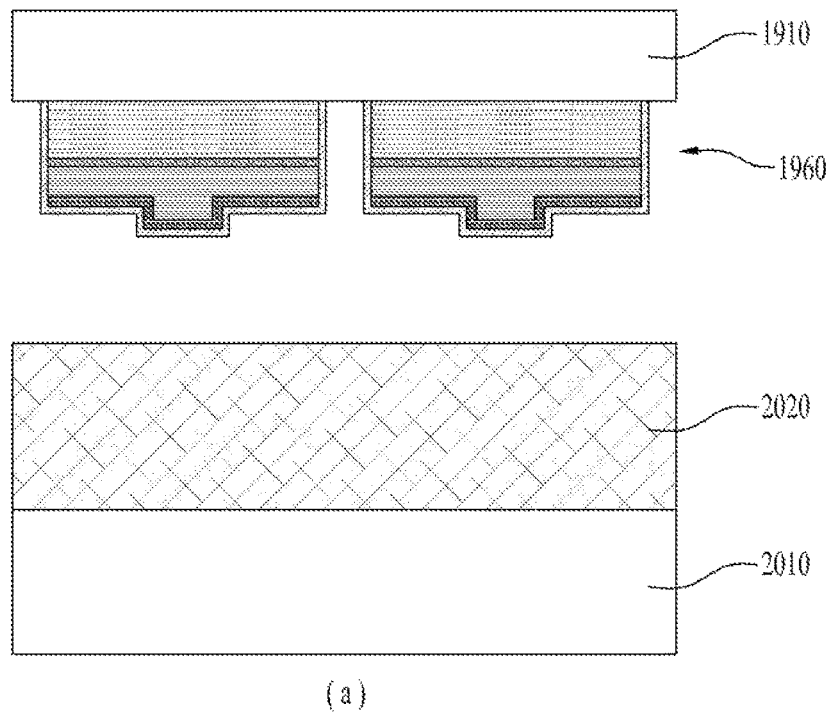
FIG. 20 illustrates cross-sectional diagrams for explaining a process of transferring the semiconductor light emitting structure shown in FIG. 19 to a temporary substrate.
Figure 20:
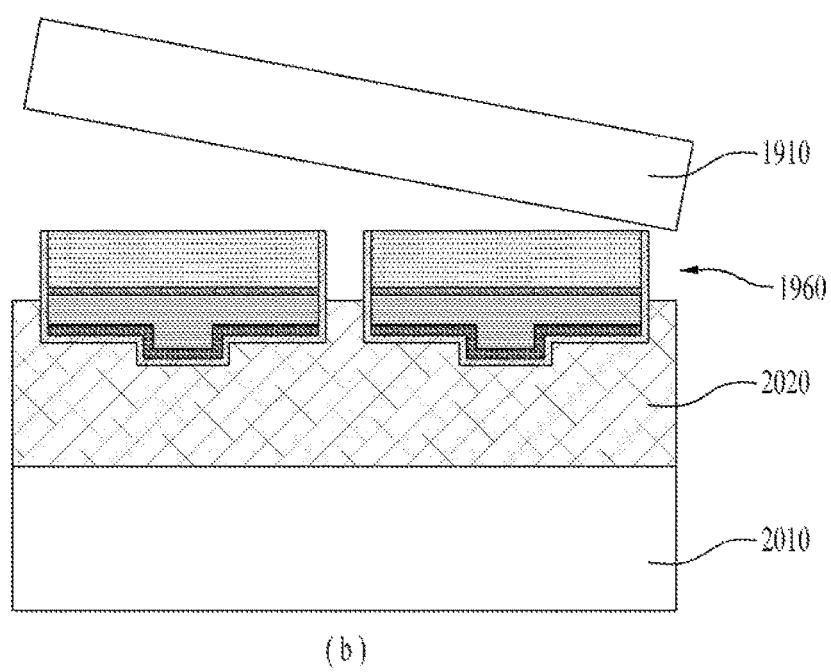

FIG. 20 illustrates cross-sectional diagrams for explaining a process of transferring the semiconductor light emitting structure shown in FIG. 19 to a temporary substrate.

As shown in FIG. 20(a), the semiconductor light emitting structure 1960 formed on the growth substrate 1910 may be transferred to a temporary substrate 2010 including an adhesive layer 2020 in order to perform a subsequent process.

The adhesive layer 2020 may be an organic stamp layer, and may include a protrusion corresponding to the semiconductor light emitting structure 1960.

As shown in FIG. 20(b), the semiconductor light emitting structure 1960 is brought into contact with the adhesive layer 2020 of the temporary substrate 2010. Thereafter, when a laser or the like is radiated to the rear surface of the growth substrate 1910, the semiconductor light emitting structure 1960 may be transferred from the growth substrate 1910 to the temporary substrate 2010.

The reason for transferring the semiconductor light emitting structure to the temporary substrate 2010 is to expose one surface of the semiconductor light emitting structure 1960, which was not exposed by the growth substrate 1910. A first conductivity-type electrode layer, a second passivation layer, and a conductive adhesive layer may be formed on the exposed surface.

Figure 21:
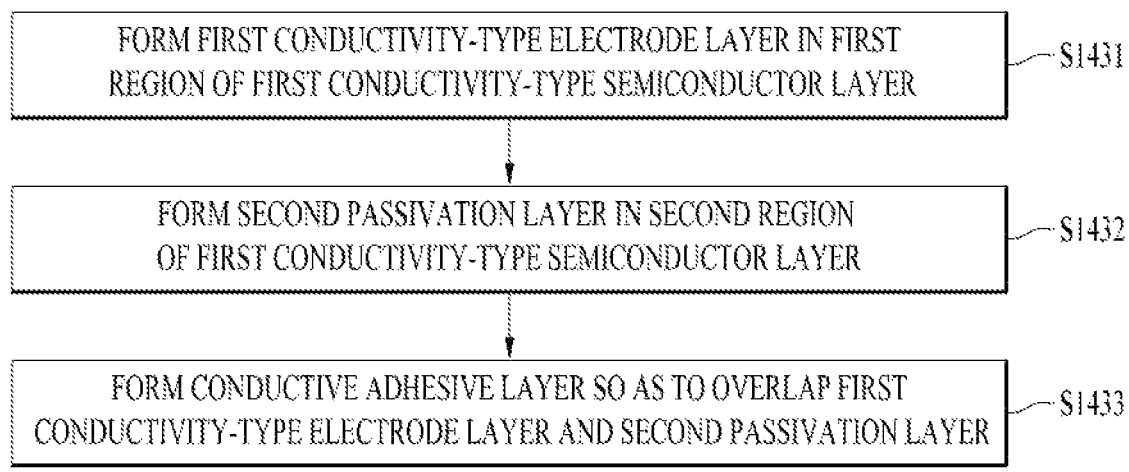
FIG. 21 is a flowchart showing a process of manufacturing a vertical type semiconductor light emitting element by forming an electrode layer and an adhesive layer on the semiconductor light emitting structure shown in FIG. 20.

FIG. 21 is a flowchart showing a process of manufacturing a vertical type semiconductor light emitting element by forming an electrode layer and an adhesive layer on the semiconductor light emitting structure shown in FIG. 20.

First, a first conductivity-type electrode layer is formed in a first region of the first conductivity-type semiconductor layer exposed through the transfer process shown in FIG. 20 (S1431).

Thereafter, a second passivation layer is formed in a second region of the first conductivity-type semiconductor layer (S1432). The first region and the second region may be defined separately on the same surface of the first conductivity-type semiconductor layer.

Finally, a conductive adhesive layer is formed so as to overlap the first conductivity-type electrode layer and the second passivation layer (S1433).

It will be apparent to those skilled in the art that omission of or changes in some steps in the flowchart shown in FIG. 21 falls within the scope of the present disclosure, in consideration of the overall gist of the present disclosure.

Figure 22:
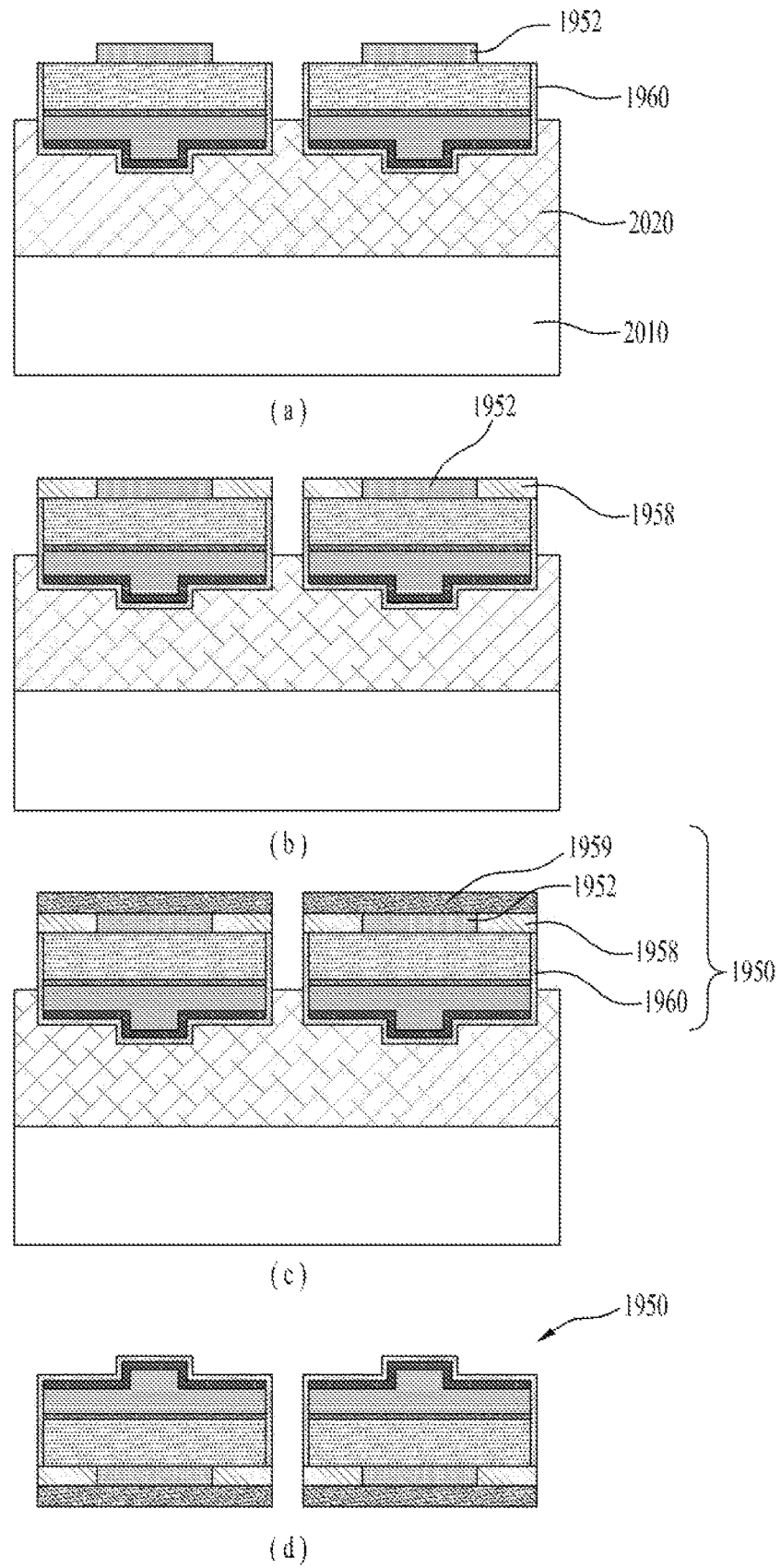
FIG. 22 illustrates cross-sectional diagrams for explaining the manufacturing process shown in FIG. 21.

FIG. 22 illustrates cross-sectional diagrams for explaining a process of manufacturing the semiconductor light emitting element shown in FIG. 21.

As shown in FIG. 22(a), a first conductivity-type electrode layer 1952, which is electrically connected to the first conductivity-type semiconductor layer, is formed on the exposed surface of the semiconductor light emitting structure 1960 transferred onto the adhesive layer 2020 of the temporary substrate 2010. In this case, the position at which the first conductivity-type electrode layer 1952 is formed corresponds to the exposed first region of the semiconductor light emitting structure 1960, as shown in FIG. 22(a). Specifically, referring to FIG. 19, the first conductivity-type electrode layer 1952 is formed on the exposed surface of the first conductivity-type semiconductor layer.

Thereafter, as shown in FIG. 22(b), a second passivation layer 1958 is formed in the second region, which is the remaining exposed surface of the first conductivity-type semiconductor layer, in which the first conductivity-type electrode layer 1952 is not formed.

Thereafter, as shown in FIG. 22(c), a conductive adhesive layer 1959 is formed so as to overlap the first conductivity-type semiconductor layer 1952 and the second passivation layer 1958, which are formed on one surface of the semiconductor light emitting structure 1960. The conductive adhesive layer 1959 may be a metal layer having a low melting point of 250 degrees Celsius or lower, and may be electrically connected to an assembly substrate in a process subsequent to the assembly process. Accordingly, a semiconductor light emitting element 1950 is manufactured such that the first conductivity-type semiconductor layer 1952, the second passivation layer 1958, and the conductive adhesive layer 1959 are included in the semiconductor light emitting structure 1960.

In addition, as shown in FIG. 22(d), the semiconductor light emitting element 1950 may be individually separated from the temporary substrate in order to perform a subsequent assembly process.

Figure 23:
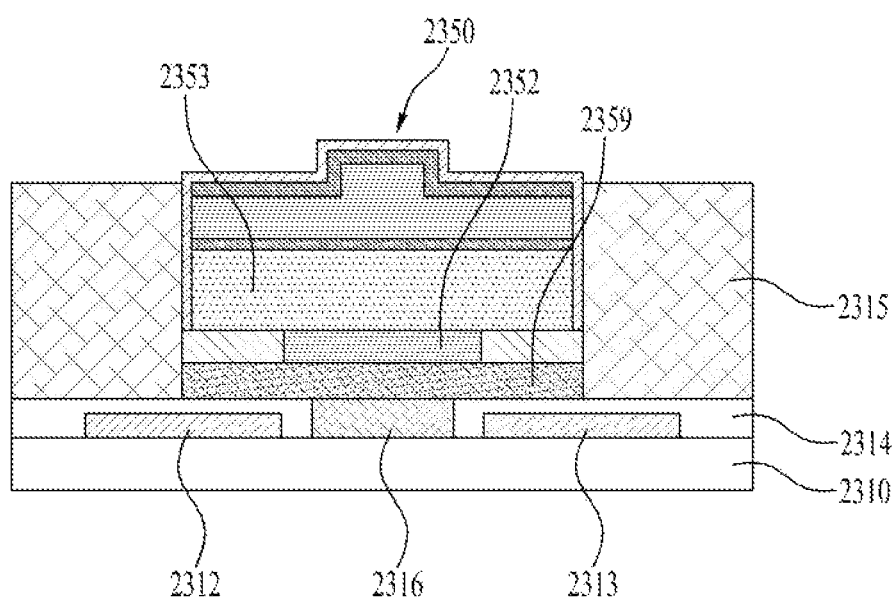
FIG. 23 is a cross-sectional diagram of a semiconductor light emitting element assembled to an assembly substrate.

FIG. 23 is a cross-sectional diagram of the semiconductor light emitting element of the present disclosure assembled to an assembly substrate.

Specifically, the semiconductor light emitting element separated individually as shown in FIG. 22 may be mounted in an assembly recess in an assembly substrate by an electric field and a magnetic field in a fluid. Therefore, as shown in FIG. 23, when the assembly process is completed, a semiconductor light emitting element 2350 is located in the assembly recess in the assembly substrate. The assembly substrate may include a wiring electrode 2316, which is formed on a substrate 2310 so as to be electrically connected to a conductive adhesive layer 2359 of the semiconductor light emitting element 2350. In addition, assembly electrodes 2312 and 2313 for generating an electric field, a dielectric film 2314 for protecting the assembly electrodes 2312 and 2313, and a partition wall 2315 for forming the assembly recess may be located on the substrate 2310.

As shown in FIG. 23, the semiconductor light emitting element 2350 has a vertical type semiconductor light emitting structure, and is provided at both ends thereof with the conductivity-type electrode layers. In particular, the conductive adhesive layer 2359 is located on the assembly surface of the semiconductor light emitting element 2350, which is brought into contact with the bottom surface of the assembly recess in the assembly substrate. The reason for this is that the area of the conductive adhesive layer is larger than that of the opposite surface having the mesa shape, and thus the semiconductor light emitting element 2350 is assembled in the direction in which the conductive adhesive layer is oriented in the assembly process.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

What is claimed is:
1. A display device comprising:
   a plurality of semiconductor light emitting elements configured to be mounted to an assembly substrate using at least one of an electric field and a magnetic field,
   wherein each of at least one semiconductor light emitting element among the plurality of semiconductor light emitting elements comprises:
      a first conductivity-type electrode layer and a second conductivity-type electrode layer disposed at opposite sides of the semiconductor light emitting element;

a first conductivity-type semiconductor layer electrically connected to the first conductivity-type electrode layer;
an active layer disposed on the first conductivity-type semiconductor layer; and
a second conductivity-type semiconductor layer disposed on the active layer and electrically connected to the second conductivity-type electrode layer,
wherein the second conductivity-type semiconductor layer has one surface including a mesa structure formed by etching a portion of the one surface,
wherein the second conductivity-type electrode layer is disposed on the one surface including the mesa structure of the second conductivity-type semiconductor layer and is configured to define a light emission region through which light generated in the active layer is emitted,
wherein the mesa structure includes a protrusion portion of the second conductivity-type semiconductor layer, and
wherein the second conductivity-type electrode layer is located on the protrusion portion of the second conductivity-type semiconductor layer inside the mesa structure and covers the entire one surface including the mesa structure of the second conductivity-type semiconductor layer.

2. The display device of claim 1, wherein the second conductivity-type electrode layer is a transparent electrode layer.

3. The display device of claim 1, wherein the semiconductor light emitting element further comprises:
a conductive adhesive layer disposed on one surface of the first conductivity-type electrode layer, the conductive adhesive layer being electrically connected to the first conductivity-type electrode layer.

4. The display device of claim 3, wherein the first conductivity-type electrode layer has a width smaller than a width of the conductive adhesive layer and larger than a width of an upper surface of the mesa structure.

5. The display device of claim 4, wherein the semiconductor light emitting element comprises:
a first passivation layer surrounding an upper surface and a side surface of the semiconductor light emitting element; and
a second passivation layer surrounding a portion of a lower surface of the semiconductor light emitting element, and
wherein the second passivation layer is located in a region between the first conductivity-type semiconductor layer and the conductive adhesive layer.

6. The display device of claim 1, wherein the assembly substrate comprises:
a first assembly electrode and a second assembly electrode configured to generate dielectrophoretic force using an electric field in a relationship with the semiconductor light emitting element.

7. The display device of claim 6, wherein the dielectrophoretic force is applied to only an upper surface of the mesa structure, and
wherein a distance in which the dielectrophoretic force is applied to the mesa structure is based on a height of the mesa structure.

8. The display device of claim 3, wherein the conductive adhesive layer is a low-melting-point metal layer having a melting point of approximately 100 to 250 degrees Celsius.

9. The display device of claim 1, wherein the semiconductor light emitting element is a light emitting diode (LED) having a size in micrometers (micro-LED).

10. A method of manufacturing a display device, the method comprising:
forming a semiconductor light emitting structure having a mesa-shaped surface on a growth substrate;
transferring the semiconductor light emitting structure to a temporary substrate;
manufacturing a vertical type semiconductor light emitting element by forming a conductivity-type electrode layer and a conductive adhesive layer on the semiconductor light emitting structure; and
assembling the vertical type semiconductor light emitting element to an assembly substrate in a fluid using an electric field and a magnetic field,
wherein the forming the semiconductor light emitting structure comprises:
stacking a first conductivity-type semiconductor layer, an active layer, and a second conductivity-type semiconductor layer;
forming a mesa-shaped portion on the second conductivity-type semiconductor layer by etching some regions of an upper surface of the second conductivity-type semiconductor layer; and
forming a second conductivity-type electrode layer on the second conductivity-type semiconductor layer including the mesa-shaped portion, wherein the second conductivity-type electrode layer is configured to define a light emission region through which light generated in the active layer is emitted,
wherein the mesa-shaped portion includes a protrusion portion of the second conductivity-type semiconductor layer, and
wherein the second conductivity-type electrode layer is located on the protrusion portion of the second conductivity-type semiconductor layer inside the mesa-shaped portion and covers an entire one surface including the mesa-shaped portion of the second conductivity-type semiconductor layer.

11. The method of claim 10, wherein the forming the semiconductor light emitting structure further comprises:
performing isolation to define an individual semiconductor light emitting structure through an etching process; and
forming a first passivation layer on an upper surface and a side surface of the semiconductor light emitting structure.

12. The method of claim 11, wherein the manufacturing the vertical type semiconductor light emitting element comprises:
forming a first conductivity-type electrode layer in a first region of the first conductivity-type semiconductor layer that is exposed by the transferring; and
forming a second passivation layer in a second region of the first conductivity-type semiconductor layer exposed through the transferring of the semiconductor light emitting structure to the temporary substrate.

13. The method of claim 12, wherein the manufacturing the vertical type semiconductor light emitting element further comprises:
forming the conductive adhesive layer so as to overlap the first conductivity-type electrode layer and the second passivation layer.

14. The method of claim 13, wherein the assembly substrate includes an assembly recess formed therein to allow the vertical type semiconductor light emitting element to be assembled thereto, and wherein the conductive adhesive layer of the vertical type semiconductor light emitting element is brought into contact with a bottom surface of the assembly recess.

15. The method of claim 10, wherein the semiconductor light emitting structure includes at least one passivation layer on the second conductivity type electrode layer, and the conductive adhesive layer below the first conductivity type electrode layer, and wherein side ends of the at least one passivation layer are aligned with side ends of the conductive adhesive layer.

16. The display device of claim 3, wherein the semiconductor light emitting element further comprises:

a passivation layer surrounding an upper surface and a side surface of the semiconductor light emitting element, and wherein side ends of the passivation layer are aligned with side ends of the conductive adhesive layer.

17. A semiconductor light emitting element device comprising:

a first conductivity-type semiconductor layer, an active layer, and a second conductivity-type semiconductor layer that are stacked, wherein the second conductivity-type semiconductor layer has one or more mesa-shaped portions protruding from an adjacent portion of the second conductivity-type semiconductor layer;

a first conductivity-type electrode layer disposed below the first conductivity-type semiconductor layer;

a second conductivity-type electrode layer disposed on the second conductivity-type semiconductor layer, wherein the second conductivity-type electrode layer covers the one or more mesa-shaped portions and the adjacent portion of the second conductivity-type semiconductor layer and is configured to define a light emission region through which light generated in the active layer is emitted; and at least one passivation layer disposed on the second conductivity-type electrode layer, wherein the one or more mesa-shaped portions include a protrusion portion of the second conductivity-type semiconductor layer, and wherein the second conductivity-type electrode layer is located on the protrusion portion of the second conductivity-type semiconductor layer inside the one or more mesa-shaped portions and covers an entire one surface including the one or more mesa-shaped portions of the second conductivity-type semiconductor layer.

18. The semiconductor light emitting element device of claim 17, further comprising:

a conductive adhesive layer disposed below the first conductivity-type electrode layer and the at least one passivation layer, wherein a width of the conductive adhesive layer is greater than a width of the first conductivity-type electrode layer.

19. The semiconductor light emitting element device of claim 17, further comprising:

a conductive adhesive layer disposed below the first conductivity-type electrode layer and the at least one passivation layer, wherein side ends of the conductive adhesive layer are aligned with side ends of the at least one passivation layer.

* * * * *